(12) United States Patent
Sakurai et al.

(10) Patent No.: US 11,295,896 B2
(45) Date of Patent: Apr. 5, 2022

(54) MULTILAYER CERAMIC ELECTRONIC COMPONENT AND METHOD OF MANUFACTURING THE SAME

(71) Applicant: TDK CORPORATION, Tokyo (JP)

(72) Inventors: Toshio Sakurai, Tokyo (JP); Hirobumi Tanaka, Tokyo (JP); Keisuke Okai, Tokyo (JP); Daisuke Iwanaga, Tokyo (JP); Hisashi Nakata, Tokyo (JP); Tomoya Shibasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/665,281

(22) Filed: Oct. 28, 2019

(65) Prior Publication Data

US 2020/0135400 A1 Apr. 30, 2020

(30) Foreign Application Priority Data

Oct. 30, 2018 (JP) .............................. JP2018-203989
Sep. 25, 2019 (JP) .............................. JP2019-174038

(51) Int. Cl.
*H01G 4/232* (2006.01)
*H01G 4/30* (2006.01)
(Continued)

(52) U.S. Cl.
CPC .............. *H01G 4/236* (2013.01); *H01G 4/30* (2013.01); *H05K 1/181* (2013.01); *H05K 1/186* (2013.01);
(Continued)

(58) Field of Classification Search
CPC .......... H01L 23/12; H01G 4/012; H01G 4/12; H01G 4/1227; H01G 4/1236; H01G 4/232; H01G 4/236; H01G 4/30; H01G 4/385; H01G 4/228; H01R 4/00; H01R 9/00; H05K 1/181; H05K 1/186; H05K 1/18;
(Continued)

(56) References Cited

U.S. PATENT DOCUMENTS 3,195,027 A * 7/1965 Weller ..................... H01R 4/00
361/307
2001/0019176 A1* 9/2001 Ahiko .................... H01G 4/012
257/777
(Continued)

FOREIGN PATENT DOCUMENTS

CN 108630436 A 10/2018
JP 2004200392 A * 7/2004 ............. H01L 23/12
(Continued)

*Primary Examiner* — Timothy J Thompson
*Assistant Examiner* — Guillermo J Egoavil
(74) *Attorney, Agent, or Firm* — Oliff PLC

(57) ABSTRACT

A multilayer ceramic electronic component includes an element body, a via-hole electrode, and a terminal electrode. The element body includes internal electrode layers and insulation layers alternately laminated in a lamination direction. The via-hole electrode penetrates from an upper surface of the element body thereinto and is connected with at least one of the internal electrode layers. The terminal electrode is formed on the upper surface of the element body and connected with the via-hole electrode. The via-hole electrode is embedded in a via hole formed on the element body so that a predetermined clearance space is formed in the via hole.

10 Claims, 14 Drawing Sheets

(51) Int. Cl.
*H05K 1/18* (2006.01)
*H01G 4/236* (2006.01)
*H01G 4/12* (2006.01)

(52) U.S. Cl.
CPC ......... *H01G 4/1227* (2013.01); *H01G 4/1236* (2013.01); *H05K 2201/10015* (2013.01)

(58) Field of Classification Search
CPC ............ H05K 3/46; H05K 3/32; H05K 3/328; H05K 2201/10015; H05K 2203/049; Y10T 29/4913
USPC ......... 361/301.4, 306.3, 321.4, 321.2, 321.5; 174/260

See application file for complete search history.

(56) References Cited

U.S. PATENT DOCUMENTS

| | | | | |
|---|---|---|---|---|
| 2012/0019978 | A1* | 1/2012 | Yoshida | H01F 27/292 |
| | | | | 361/301.4 |
| 2013/0327565 | A1* | 12/2013 | Qu | H05K 3/403 |
| | | | | 174/266 |
| 2014/0133065 | A1* | 5/2014 | Armstrong | H01G 4/385 |
| | | | | 361/321.2 |
| 2015/0007933 | A1* | 1/2015 | Iketani | H05K 3/429 |
| | | | | 156/247 |
| 2015/0348713 | A1* | 12/2015 | Hirao | H01G 4/12 |
| | | | | 361/301.4 |
| 2018/0277305 | A1 | 9/2018 | Kawakami et al. | |
| 2019/0385796 | A1* | 12/2019 | Hopwood | H01G 4/228 |

FOREIGN PATENT DOCUMENTS

| | | | | |
|---|---|---|---|---|
| JP | 2009051145 A | * | 3/2009 | ............ B41J 2/045 |
| JP | 2011129597 A | * | 6/2011 | ............ H01G 4/12 |
| JP | 2017-028254 A | | 2/2017 | |

* cited by examiner

MULTILAYER CERAMIC ELECTRONIC COMPONENT AND METHOD OF MANUFACTURING THE SAME

BACKGROUND OF THE INVENTION

The present invention relates to a multilayer ceramic electronic component used as, for example, a multilayer ceramic capacitor and to a method of manufacturing it. Specifically, the present invention relates to a multilayer ceramic electronic component capable of being thinned and to a method of manufacturing it.

In accordance with miniaturization of electronic equipment, an electronic component to be mounted on an electronic substrate is also demanded to be downsized and thinned. In the actual circumstances, a mounting area for the component is conversely becoming smaller whereas higher functionality, higher integration, and improved characteristics of LSI are required. In the mounting of the electronic component, a technology of embedding the electronic component into a printed wiring board for achieving three-dimensional mounting has been put into practical use as a mounting technology to replace conventional substrate surface mounting technology.

As shown in Patent Document 1, however, it is normal that a conventional multilayer ceramic capacitor has terminal electrodes on both ends in the longitudinal direction of the element body, and that each of the terminal electrodes has an electrode part at the end of the element body and covering electrode parts covering the upper and lower surfaces of the element body. In such a conventional multilayer ceramic capacitor, the element body is hard to be thinned, and the low profile is thereby difficult.

Incidentally, also known is a multilayer ceramic capacitor where the terminal electrode is formed only on the upper surface of the element body by forming via-hole electrodes are formed inside the element body, but such a conventional multilayer ceramic capacitor is comparatively thick and is hard to be thinned.

In particular, when a load is transmitted to the element body at, for example, nozzle adsorption for picking up a multilayer ceramic capacitor in its mounting step, there is a problem of easily breaking the multilayer ceramic capacitor due to small thickness of the element body.

Patent Document 1: JP201728254 (A)

BRIEF SUMMARY OF INVENTION

The present invention has been achieved under such circumstances. It is an object of the invention to provide a multilayer ceramic electronic component being capable of low profile and hard to be broken, such as multilayer ceramic capacitors, and also provide a method of manufacturing it.

To achieve the above object, a multilayer ceramic electronic component according to the present invention includes:

an element body including internal electrode layers and insulation layers alternately laminated in a lamination direction;

a via-hole electrode penetrating from an upper surface of the element body thereinto and connected with at least one of the internal electrode layers; and a terminal electrode formed on the upper surface of the element body and connected with the via-hole electrode, wherein the via-hole electrode is embedded in a via hole formed on the element body so that a predetermined clearance space is formed in the via hole.

In the multilayer ceramic electronic component according to the present invention, the via-hole electrode is embedded into the via hole formed on the element body so that the predetermined clearance space is formed in the via hole. Since the clearance space is formed in the via hole, a load from outside generates a metal deformation against the clearance space and is less transmitted to the ceramic element body. Thus, the element body is further strengthened even if it is thinned, and the element body has fewer cracks and is less broken.

In the multilayer ceramic electronic component according to the present invention, the multilayer ceramic electronic component can have a small total thickness of 100 μm or less (preferably 90 μm or less, more preferably 80 μm or less), and this contributes to a low profile of the multilayer ceramic electronic component. Thus, the multilayer ceramic electronic component according to the present invention is easily contained in a board, and the package including the board can be downsized.

Preferably, an area ratio of the clearance space to the via-hole electrode is 1 to 60% (more preferably 5 to 60%, still more preferably 5 to 30%) on a cross section of the element body parallel to the internal electrode layers. In this range, the element body is further strengthened even if it is thinned, and the element body has fewer cracks and is improved in thermal shock characteristics.

When the via hole is viewed from the upper surface of the element body, the via hole may have any shape, such as circular shape and slit shape. In particular, when the via hole has a slit groove shape, the clearance space is easily formed in the via hole. The via hole having a slit groove shape may be formed to have a width that is substantially equal to a width of the element body. Both ends of the via hole having a slit groove shape may be open to the outside of the element body or may be covered with an insulating cover layer (or a reinforcement layer).

Preferably, the via-hole electrode is located on an inner side of the element body in the via hole, and the clearance space is located on an outer side of the element body in the via hole. In this structure, a stress generated in the element body by external force more easily escapes to the outside, and the multilayer ceramic electronic component is thereby further strengthened. This tendency is strong particularly when the via hole has a slit groove shape.

Preferably, the via hole includes a first via hole and a second via hole, the via-hole electrode includes a first via-hole electrode inserted into the first via hole and a second via-hole electrode inserted into the second via hole, a first leading part, one end of one of the internal electrode layers adjacent in the lamination direction, is led to or close to either of lateral surfaces of the element body, a second leading part, the other end of one of the internal electrode layers adjacent in the lamination direction, is led to or close to the other lateral surface of the element body, the first via-hole electrode is connected with the first leading part, and the second via-hole electrode is connected with the second leading part.

Preferably, no electrode layer is formed on a lower surface or lateral surfaces of the element body. In this structure, a stress generated in the element body by external force more easily escapes to the outside, and the multilayer ceramic electronic component is thereby further strengthened. When no electrode layer is formed on the lower surface of the element body, the lower surface of the element body is easily a flat surface and is, for example, easily embedded into the board.

A reinforcement layer may cover a lower surface and/or lateral surfaces of the element body. Compared to the insulation layers, the reinforcement layer may be made of an insulation material having a low elasticity or a low linear thermal expansion coefficient.

A method of manufacturing a multilayer ceramic electronic component according to the present invention includes the steps of:

preparing an element body including internal electrode layers and insulation layers alternately laminated in a lamination direction;

forming a via hole on the element body;

embedding a first conductive paste containing 70 mass % or more of conductive component into the via hole so that a predetermined clearance space is formed in the via hole;

embedding a second conductive paste containing 70 mass % or more of resin beads into the predetermined clearance space in the via hole; and forming a via-hole electrode by heating the first conductive paste and the second conductive paste.

In the method according to the present invention, the resin beads are vaporized and run away from the via hole in forming the via hole electrode, and the predetermined clearance space is formed in the via hole. Thus, the above-mentioned multilayer ceramic electronic component according to the present invention is easily manufactured.

DETAILED DESCRIPTION OF INVENTION

Hereinafter, the present invention is described based on embodiments shown in the figures.

First Embodiment

As an embodiment of a multilayer ceramic electronic component according to the present embodiment, a multilayer ceramic capacitor is described.

Figure 1A:
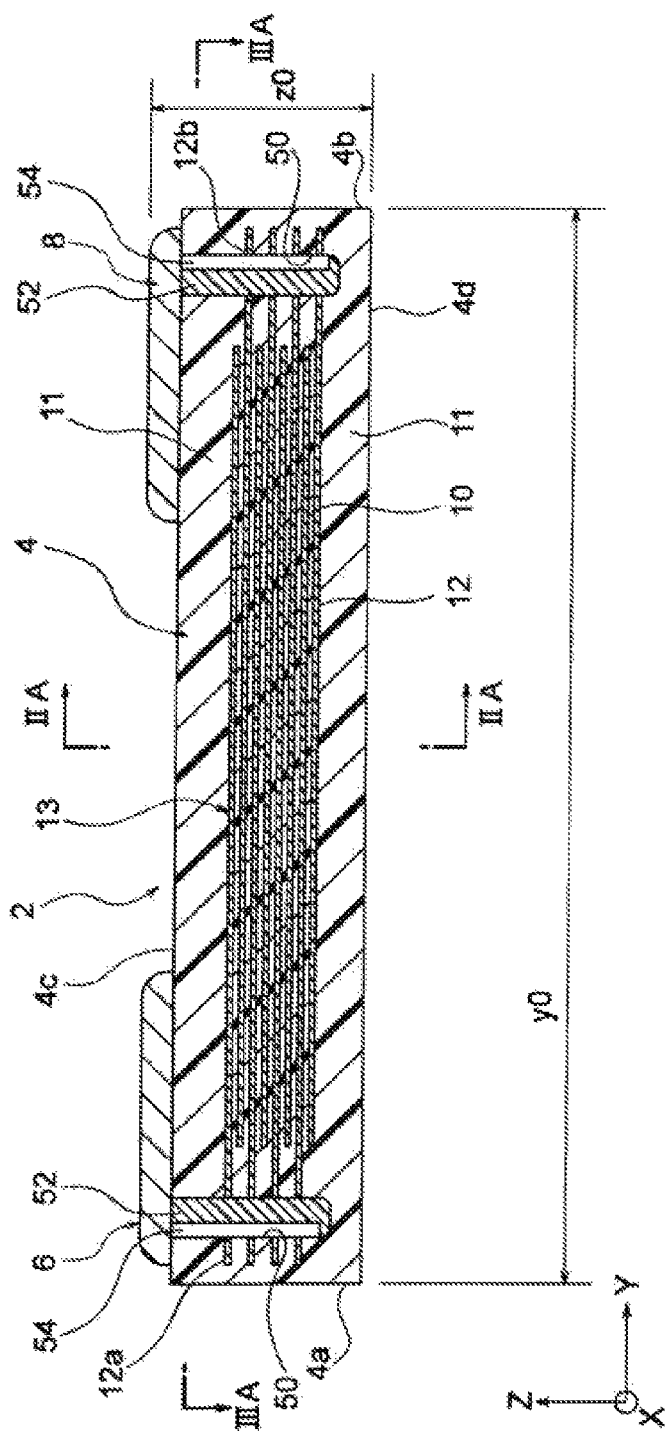
FIG. 1A is a longitudinal cross-sectional view of a multilayer ceramic capacitor according to an embodiment of the present invention.

As shown in FIG. 1A, a multilayer ceramic capacitor 2 according to the present embodiment includes an element body 4, a first terminal electrode 6, and a second terminal electrode 8. The element body 4 includes inner dielectric layers (insulation layers) 10 and internal electrode layers 12 in substantially parallel to the plane including the X-axis and the Y-axis. The internal electrode layers 12 are alternately laminated along the Z-axis direction between the inner dielectric layers 10. Here, "substantially parallel" means that most part is parallel, but there may be a part that is not slightly parallel. The internal electrode layers 12 and the inner dielectric layers 10 may slightly be uneven or inclined.

An interior region 13 is a region where the inner dielectric layers 10 and the internal electrode layers 12 are alternately laminated. The element body 4 has exterior regions 11 on both end surfaces of the element body 4 in its lamination direction Z (Z-axis). The exterior regions 11 are formed by laminating a plurality of outer dielectric layers that are thicker than the inner dielectric layers 10 constituting the interior region 13. Preferably, the thickness of the interior region 13 in the Z-axis direction is 10 to 75% of a total thickness z0 of the multilayer ceramic capacitor 2. The total thickness of the two exterior regions 11 is a value obtained by subtracting the thickness of the interior region 13 and the thickness of the terminal electrode 6 (8) from the total thickness z0.

Hereinafter, the "inner dielectric layers 10" and the "outer dielectric layers" may be referred to as the "dielectric layers" together.

The dielectric layers constituting the inner dielectric layers 10 and the exterior regions 11 may be made of the same material or different materials and are made of any material whose main component is a perovskite-type dielectric material, such as $ABO_3$.

In $ABO_3$, "A" is at least one of Ca, Ba, Sr, etc., and "B" is at least one of Ti, Zr, etc. The molar ratio of A/B is not limited and 0.980 to 1.020. In addition, the dielectric layers constituting the inner dielectric layers 10 and the exterior regions 11 may contain a sub-component of an oxide of rare earth element (at least one of Sc, Y, La, Ce, Pr, Nd, Pm, Sm, Eu, Gd, Tb, Dy, Ho, Er, Tm, Yb, and Lu), alkaline earth metal element (Mg and Mn), and transition metal element (at least one of V, W, and Mo), a mixture thereof, a composite oxide, a sintering agent containing $SiO_2$ as glass, and the like.

The internal electrode layers 12 alternately laminated on one side have leading parts 12a electrically connected with an inner side of a via-hole electrode (first via-hole electrode) 52 in a via hole (first via hole) 50 formed near a first lateral surface 4a of the element body 4 in the Y-axis direction. The internal electrode layers 12 alternately laminated on the other side have leading parts 12b electrically connected with an inner side of a via-hole electrode (second via-hole electrode) 52 in a via hole (second via hole) formed near a second lateral surface 4b of the element body 4 in the Y-axis direction.

The via-hole electrode 52 in the via hole 50 formed near the first lateral surface 4a of the element body 4 in the Y-axis direction is connected with the first terminal electrode 6 closely formed near the first lateral surface 4a on an upper surface 4c of the element body 4. The via-hole electrode 52 in the via hole 50 formed near the second lateral surface 4b of the element body 4 in the Y-axis direction is connected with the second terminal electrode 8 closely formed near the second lateral surface 4b on the upper surface 4c of the element body 4. The first terminal electrode 6 and the second terminal electrode 8 are formed away from each other on the upper surface 4c of the element body 4 with a predetermined distance in the Y-axis direction and are insulated from each other.

In the figures, the X-axis, the Y-axis, and the Z-axis are perpendicular to each other. The Z-axis corresponds to the lamination direction of the inner dielectric layers 10 and the internal electrode layers 12, and the Y-axis corresponds to a direction where the leading parts 12a and 12b are led.

Figure 2A:
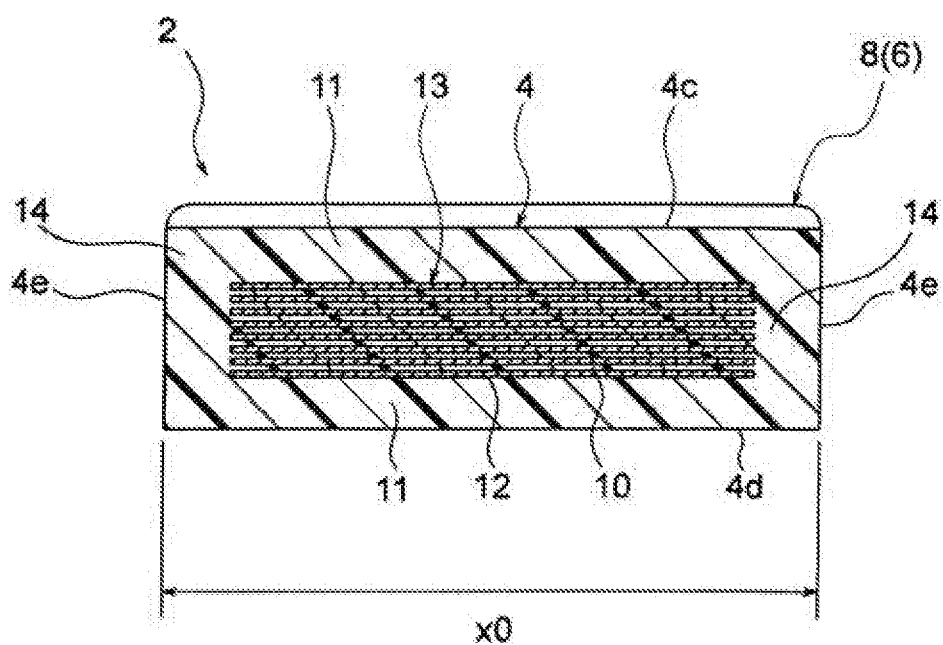
FIG. 2A is a transverse cross-sectional view of the multilayer ceramic capacitor along the IIA-IIA line shown in FIG. 1A.
Figure 2A:
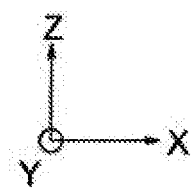

The interior region 13 has a capacitance region and leading regions. The capacitance region is a region where the internal electrode layers 12 sandwich the inner dielectric layers 10 and are laminated along the lamination direction. The leading regions are located between the leading parts 12a and 12a (12b and 12b) of the internal electrode layers 12 connected with each of the via-hole electrodes 52 and 52 formed on both sides of the element body 4 in the Y-axis direction. Moreover, side-gap regions 14 shown in FIG. 2A are located on both ends of the internal electrode layers 12 in the X-axis direction and protect the internal electrode layers 12. The side-gap regions 14 are normally made of a dielectric material similar to that of the inner dielectric layers 10 or the exterior regions 11, but may be made of a glass material to be a lateral reinforcement layer 19 mentioned below (see FIG. 2C). The exterior regions 11 shown in FIG. 1A may also be made of a glass material.

A conductive material contained in the internal electrode layers 12 is any material, such as metal of Ni, Cu, Ag, Pd, Al, Pt, etc. and alloy of these metals. The Ni alloy is preferably an alloy of Ni and one or more elements of Mn, Cr, Co, and Al and preferably contains 95 mass % or more of Ni. Incidentally, Ni or the Ni alloy may contain about 0.1 mass % or less of various fine components, such as P.

The first and second terminal electrodes 6 and 8 are made of any material, such as at least one of Ni, Pd, Ag, Au, Cu, Pt, Rh, Ru, Ir, etc. and alloy of these elements. The terminal electrodes 6 and 8 are normally made of Cu, Cu alloy, Ni, Ni alloy, Ag, Ag—Pd alloy, In—Ga alloy, or the like. The first and second terminal electrodes 6 and 8 may be formed by a single layer, but may have a multilayer structure of multiple layers.

The via-hole electrodes 52 are also made of any material similar to the material of the first and second terminal electrodes 6 and 8 (not necessarily the same material), but are particularly preferably made of Cu, Cu alloy, Ni, Ni alloy, Ag, Ag—Pd alloy, In—Ga alloy, etc. Incidentally, when the via-hole electrodes 52 and the first and second terminal electrodes 6 and 8 are made of the same material, the connection reliability between the via-hole electrodes 52 and the first and second terminal electrodes 6 and 8 is improved. The via-hole electrodes 52 are formed by a single layer, but may have a multilayer structure of multiple layers.

Figure 3A:
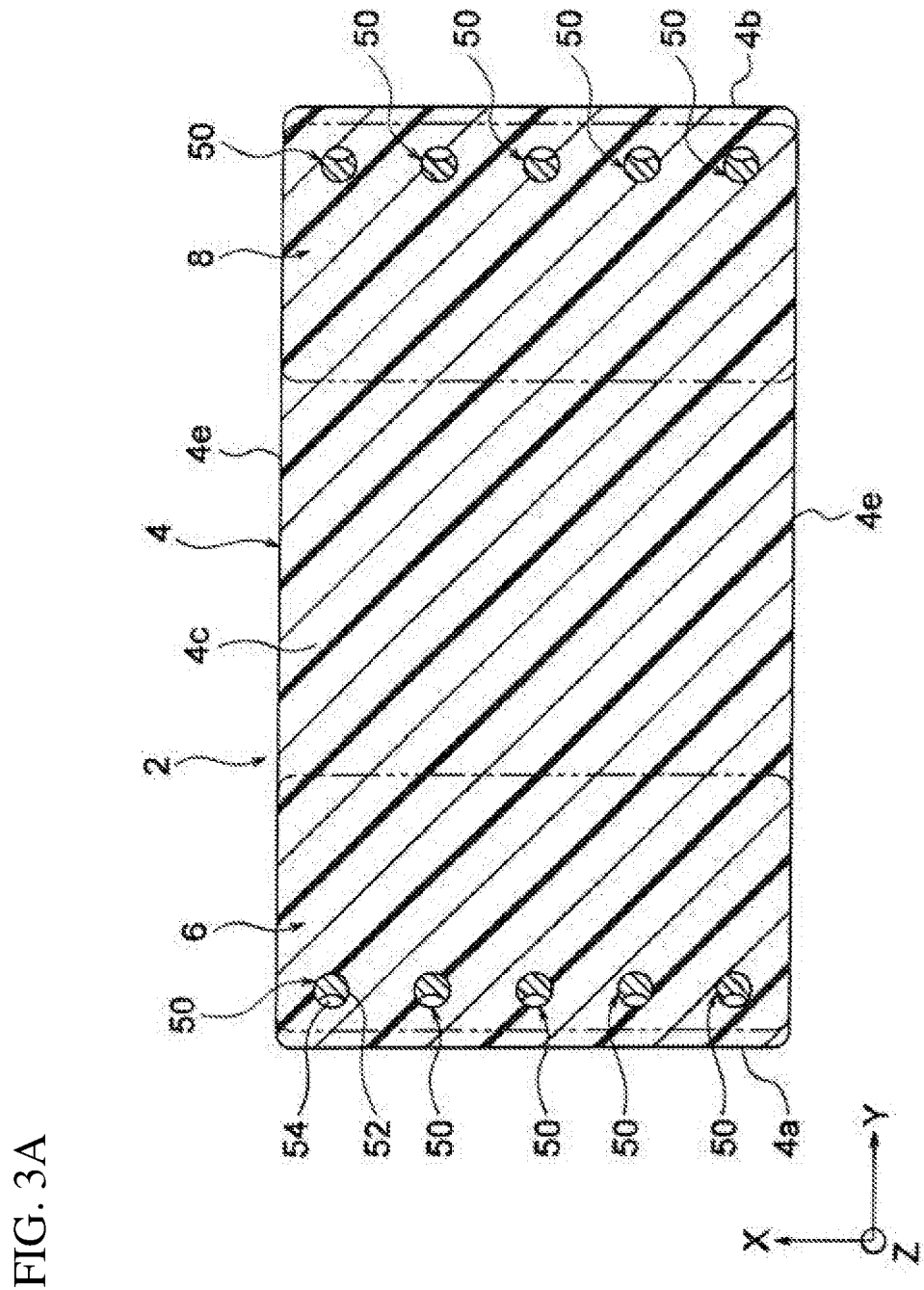
FIG. 3A is a top view of the multilayer ceramic capacitor along the IIIA-IIIA line shown in FIG. 1A.

In the present embodiment, as shown in FIG. 3A, the via-hole electrodes 52 are filled in the via holes 50 formed with predetermined intervals in the X-axis direction on a cross section of the element body 4 substantially perpendicular to the Z-axis so that predetermined clearance spaces 54 are formed in the via holes 50. The predetermined intervals in the X-axis direction are preferably constant, but may be variable. In the present embodiment, each of the via holes 50 has a transverse surface (a cross section perpendicular to the longitudinal direction of the via holes) of circle, but may have a transverse surface of oval or polygonal.

Preferably, each of the via holes 50 has an inner diameter (a diameter of an inscribed circle when the transverse surface has a shape other than circle) of 50 to 150 μm. The via holes 50 preferably have a substantially same inner diameter, but may have different inner diameters.

The via-hole electrode formed on each of the via holes 50 has any cross-sectional shape. In the embodiment shown in FIG. 3A, each of the via-hole electrodes has a crescent cross section, and the cross-sectional shape of the clearance space 54 is a shape formed by subtracting the crescent shape from the circular shape. In the present embodiment, the clearance spaces 54 in the via holes 50 located closer to the first lateral surface 4a of the element body 4 in the Y-axis direction are located near the first lateral surface 4a, and the clearance spaces 54 in the via holes 50 located closer to the second lateral surface 4b of the element body 4 in the Y-axis direction are located near the second lateral surface 4b. That is, the clearance spaces 54 are directed to the outside of the element body 4 in the Y-axis direction.

In the present embodiment, an area ratio of the clearance space 54 to the via-hole electrode 52 (clearance space ratio) is preferably 1 to 60% (more preferably 5 to 60%, still more preferably 5 to 30%). Incidentally, for example, the clearance space ratio is measured as below. That is, in each of the via holes 50, three transverse cross sections are observed in the depth direction, and an average of the clearance space ratios is obtained. Preferably, the clearance space ratios have an average of 1 to 60% (more preferably 5 to 60%, still more preferably 5 to 30%). Incidentally, one of the three transverse cross sections is a central part of each of the via holes 50 in the depth direction, and the other two transverse cross sections are boundary parts between the interior region 13 and the two exterior regions 11.

In the present embodiment, the clearance space ratio is preferably 1 to 60% (more preferably 5 to 60%, still more preferably 5 to 30%) in preferably all of the via holes 50, but this is not necessarily the case with all of the via holes 50, and the clearance space ratio is in the above-mentioned range in 80% or more (or 90% or more) of the via holes 50.

In the present embodiment, the first and second terminal electrodes 6 and 8 may be a single film or multiple films. When the first and second terminal electrodes 6 and 8 are multiple films, the base layer contacted with the via-hole electrode 52 preferably contains a main metal or an alloy constituting the via-hole electrode 52. Each of the first and second terminal electrodes 6 and 8 has any thickness, but preferably has a thickness of 2 to 15 μm.

In the present embodiment, as shown in FIG. 1A and FIG. 2A, the first and second terminal electrodes 6 and 8 are formed only on the upper surface 4c of the element body 4 and are not formed on any of the first lateral surface 4a, the second lateral surface 4b, lateral surfaces 4e, or a lower surface 4d of the element body 4. The lower surface 4d of the element body 4 is not covered with the first and second terminal electrodes 6 and 8 and is entirely exposed to the outside. Moreover, the lower surface 4d of the element body 4 is formed on a flat surface. Unlike the upper surface 4c, since the lower surface 4d of the element body 4 is not covered with the first and second terminal electrodes 6 and 8, the lower surface 4d has no step of the first and second terminal electrodes 6 and 8 and is excellent in flatness.

The multilayer ceramic capacitor 2 has a shape and a size appropriately determined based on purpose and use. In the present embodiment, the multilayer ceramic capacitor 2 can have a small total thickness z0 in the Z-axis direction (e.g., 100 μm or less, preferably 90 μm or less, and more preferably 80 μm or less). This contributes to a low profile of the multilayer ceramic capacitor 2.

In the present embodiment, the length y0 of the capacitor 2 in the Y-axis direction (longitudinal length) can be three times or more than the thickness z0 and can preferably be 300 μm or more (more preferably, 400 to 1200 μm), and the width x0 of the capacitor 2 in the X-axis direction (see FIG. 2A) can be twice or more than the thickness z0 and can preferably be 200 μm or more (more preferably, 200 to 600 μm).

In the present embodiment, the capacitor 2 may appropriately be configured to have a longitudinal direction in the X-axis direction and a short direction in the Y-axis direction. In this case, the length x0 of the capacitor 2 in the X-axis direction can be three times or more than the thickness z0 and can preferably be 300 μm or more (more preferably, 400 to 1200 μm), and the length y0 of the capacitor 2 in the Y-axis direction can be twice or more than the thickness z0 and can preferably be 200 μm or more (more preferably, 200 to 600 μm).

Figure 4:
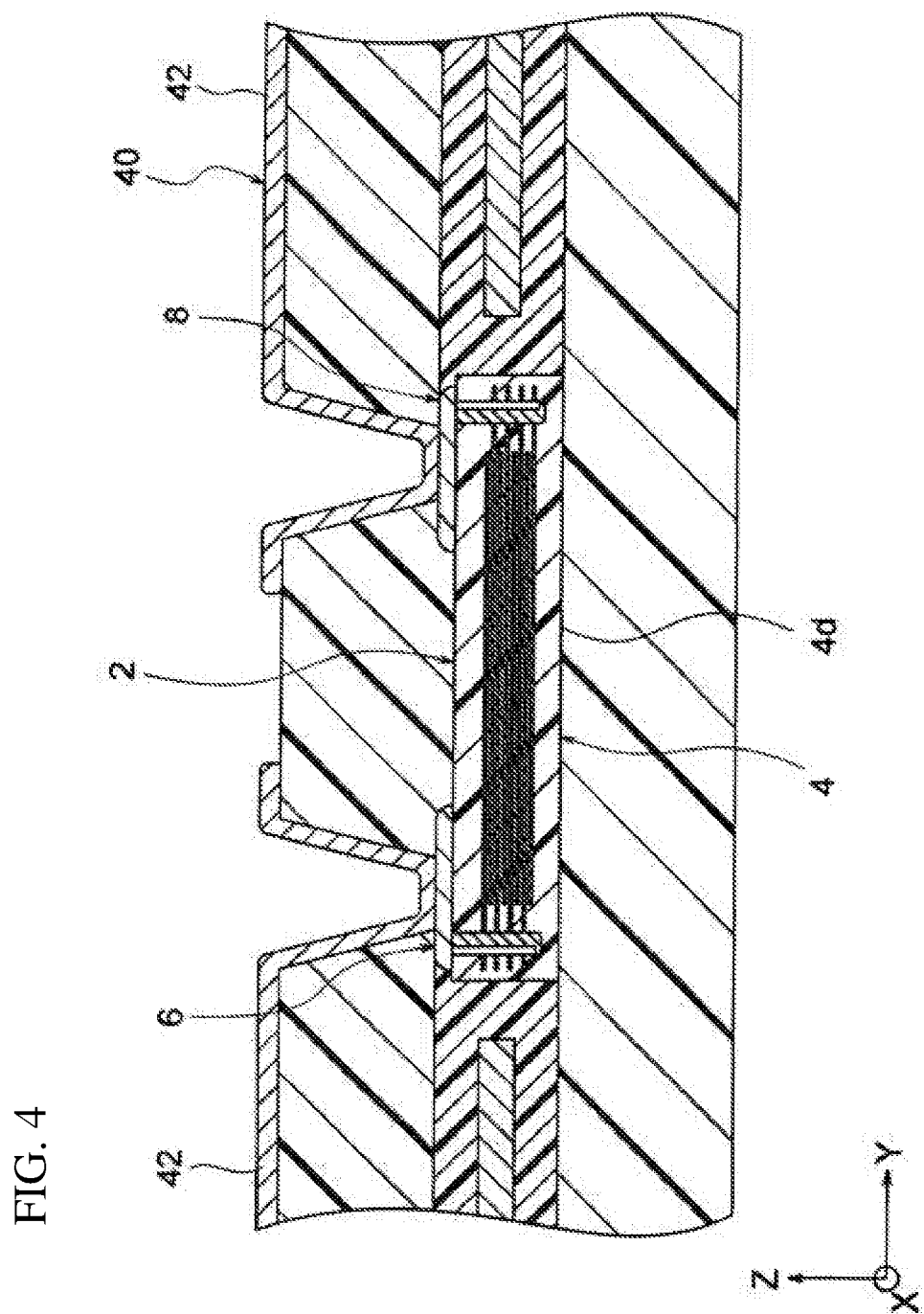
FIG. 4 is a cross-sectional view of a main part of the multilayer ceramic capacitor shown in FIG. 1A illustrating a use example thereof.

In the multilayer ceramic capacitor 2 according to the present embodiment, since the lower surface 4d of the element body 4 is a flat surface, the capacitor 2 is easily embedded into a multilayer substrate 40 as shown in, for example, FIG. 4. In FIG. 4, a wiring pattern 42 formed on the multilayer substrate 40 is connected with the first and second terminal electrodes 6 and 8 of the capacitor 2 via a through hole electrode or so. In the present embodiment, when the flat surface (the lower surface of the element body 4) is placed on a mount surface, the element body 4 is closely attached on the mount surface, and the multilayer ceramic capacitor 2 has an improved bending strength.

In the present embodiment, the exterior regions 11 forming the upper surface 4c and the lower surface 4d of the element body 4 may be made of a dielectric material that is stronger than the inner dielectric layers 10. This structure further improves the bending strength of the multilayer ceramic capacitor 2. When the multilayer ceramic capacitor 2 has an improved strength, the element body 4 easily has a large length y0 in the longitudinal direction or a large width x0, a facing area between the internal electrode layers 12 in the element body 4 is large, and characteristics (e.g., capacitance) are improved. Moreover, the side-gap regions 14 shown in FIG. 2A may be made of a dielectric material that is stronger than the inner dielectric layers 10.

The multilayer ceramic capacitor 2 according to the present embodiment is preferably used as a decoupling capacitor, but is not limited thereto and is used as a high voltage capacitor, a low ESL capacitor, a large capacity capacitor, or the like.

Next, specifically described is a method of manufacturing the multilayer ceramic capacitor 2 as an embodiment of the present invention.

To manufacture inner green sheets that will be constituting the inner dielectric layers 10 shown in FIG. 1 after firing and outer green sheets that will be constituting the exterior regions 11 after firing, a paste for the inner green sheets and a paste for the outer green sheets are initially prepared. The paste for the inner green sheets and the paste for the outer green sheets are made of an aqueous paste or an organic-solvent-based paste obtained by kneading a ceramic powder with an organic vehicle.

A raw material of the ceramic powder may appropriately be selected from various compounds to be a composite oxide or an oxide, such as carbonate, nitrate, hydroxide, and organometallic compound, and these various compounds can be mixed for use. In the present embodiment, the raw material of the ceramic powder is preferably used as a powder having an average grain size of 0.45 μm or less (preferably, about 0.1 to 0.3 μm). To obtain extremely thin inner green sheets, it is preferable to use a powder that is finer than the thickness of the green sheets.

The organic vehicle is an organic solvent in which a binder is dissolved. The binder used for the organic vehicle may be any binder selected appropriately from normally used various binders, such as ethyl cellulose and polyvinyl butyral. The organic solvent to be used may also be any solvent appropriately selected from various organic solvents, such as acetone and methyl ethyl ketone.

If necessary, the pastes for the green sheets may be added with an additive selected from various dispersants, plasticizes, dielectrics, sub-component chemical compound, glass frit, insulators, and the like. Examples of the plasticizers include phthalic acid esters (e.g., dioctyl phthalate and benzylbutyl phthalate), adipic acid, phosphoric esters, and glycols.

To manufacture internal electrode pattern layers that will be constituting the internal electrode layers 12 shown in FIG. 1A after firing, a paste for the internal electrode layers is subsequently prepared. The paste for the internal electrode layers is prepared by kneading a conductive material made of the above-described various conductive metals or alloys with the above-described organic vehicle.

A paste for the terminal electrodes that will be constituting the first and second terminal electrodes 6 and 8 shown in FIG. 1A after firing is prepared similarly to the above-mentioned paste for the internal electrode layers. A method of preparing an electrode paste to be the via-hole electrodes 52 is mentioned below.

An internal multilayer body is manufactured by alternately laminating the inner green sheets and the internal electrode pattern layers using the paste for the inner green sheets and the paste for the internal electrode layers prepared in the above-mentioned manner. After the internal multilayer body is manufactured, a green multilayer body is obtained by forming outer green sheets using the paste for the outer green sheets and pressing them in the lamination direction.

Instead of the above-mentioned method, the green multilayer body may be obtained by alternately directly laminating a predetermined number of the inner green sheets and the internal electrode pattern layers on the outer green sheets and pressing them in the lamination direction.

Specifically, the inner green sheets are formed on carrier sheets (e.g. PET films) as support members by a doctor blade method or so. The inner green sheets are dried after being formed on the carrier sheets.

Next, the inner green sheets with the internal electrode pattern layers are obtained by forming the internal electrode pattern layers on the surfaces of the inner green sheets using the paste for the internal electrode layers. After the internal multilayer body is manufactured by laminating the multiple inner green sheets with the internal electrode pattern layers, a green multilayer body is subsequently obtained by forming an appropriate number of the outer green sheets on the top and bottom of the internal multilayer body using the paste for the outer green sheets and pressing them in the lamination direction.

Next, green chips are obtained by cutting the green multilayer body into pieces. Incidentally, the internal electrode pattern layers are formed by any method for forming thin films, such as printing method, transfer method, vapor deposition, and sputtering.

The green chips are solidified by removing the plasticizer based on solidification and dry. The element body 4 is obtained by subjecting the green chips after the solidification and dry to a debinding step, a firing step, and if necessary, an annealing step. The debinding step, the firing step, and the annealing step may be carried out continuously or independently.

Next, as shown in FIG. 3A, the via holes 50 are formed in a predetermined pattern on the upper surface 4c of the element body 4. The via holes 50 can be formed by, for example, etching, but can also be formed by laser irradiation, reactive ion etching, photolithography, etc. After that, a first conductive paste is embedded into the via holes 50, for example, in the pattern of the via-hole electrodes 52 shown in FIG. 3A. The first conductive paste is manufactured similarly to the paste for the internal electrodes, but the component of the conductive material composed of various conductive metals or alloys is preferably 70 mass % or more (more preferably, 72 to 77 mass %).

Next, a second conductive paste is embedded into the vacant spaces of the via holes 50, which are not embedded with the first conductive paste. The second conductive paste is prepared similarly to the first conductive paste with a similar conductive material. In the second conductive paste, however, the component of the conductive material is extremely smaller (may be 0 mass %) than that of the first conductive paste, and the ratio of the resin beads is 70 mass % or more (preferably, 72 to 77 mass %). The conductive pastes are embedded into the via holes 50 in a predetermined pattern by any means, such as screen printing, metal mask printing, and dispenser application.

After the first and second conductive pastes are embedded into the via holes 50, a heat treatment for firing the pastes is carried out. The heat treatment is carried out with any conditions, but is carried out, for example, in $N_2$ atmosphere at a temperature of 700 to 1000° C. Due to the heat treatment, the resin beads of the second conductive paste are vaporized and run away from the via holes 50. Thus, the clearance space 54 with a predetermined pattern is formed in the via holes 50.

Next, the paste for the terminal electrodes is applied with a predetermined pattern on the upper surface 4c of the element body 4 and is fired to form the first and second terminal electrodes 6 and 8. The first and second terminal electrodes 6 and 8 can also be formed by, for example, screen printing in a similar manner to the via-hole electrodes 52. Unlike the second conductive paste of the via-hole electrodes 52, when the first and second terminal electrodes 6 and 8 are formed, the conductive paste contains no resin beads or so. The first and second terminal electrodes 6 and 8 may slightly enter the clearance spaces 54 of the via holes 50, but may be up to near the upper surface 4c. Preferably, the first and second terminal electrodes 6 and 8 do not reach the leading parts 12a and 12a.

Incidentally, the first and second terminal electrodes 6 and 8 are formed by any appropriate method, such as application and baking, plating, vapor deposition, and sputtering of the paste for the terminal electrodes. If necessary, a cover layer is formed on the surfaces of the first and second terminal electrodes 6 and 8 by plating or so. The cover layer is a gold plating, tin plating, or the like.

The multilayer ceramic capacitor 2 according to the present embodiment manufactured in the above-mentioned manner is mounted on a print board or so by soldering or so and is used for various electronic devices. Instead, as shown in FIG. 4, the multilayer ceramic capacitor 2 of the present embodiment is used by being embedded into the multilayer substrate 40.

Figure 5:
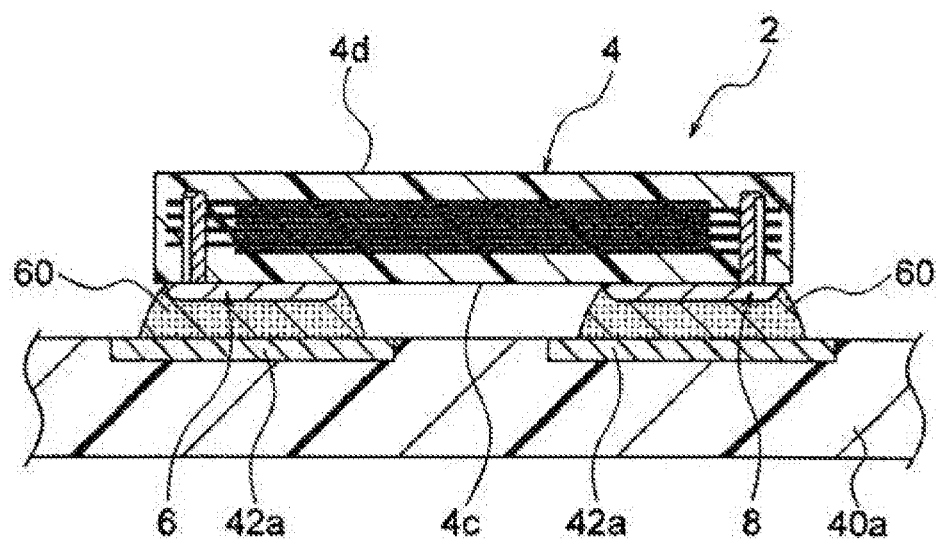
FIG. 5 is a cross-sectional view of a main part of the multilayer ceramic capacitor shown in FIG. 1A illustrating another use example thereof.
Figure 5:
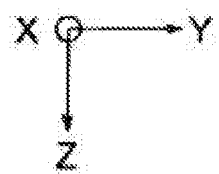

Instead, as shown in FIG. 5, the multilayer ceramic capacitor 2 according to the present embodiment may be mounted on a circuit board 40a using a solder 60. In this case, the capacitor 2 is disposed upside down in the Z-axis direction, and the first and second terminal electrodes 6 and 8 are directed downward in the figure and connected with a wiring pattern 42a of the circuit board 40a by the solder 60.

In the multilayer ceramic capacitor 2 according to the present embodiment, the first and second terminal electrodes 6 and 8 are not substantially formed on the lower surface 4d of the element body 4, or the lower surface 4d of the element body 4 is entirely exposed. Then, the multilayer ceramic capacitor 2 can have a small total thickness z0 of 100 μm or less (preferably 90 μm or less, more preferably 80 μm or less). That is, this contributes to a low profile of the multilayer ceramic capacitor. Thus, the multilayer ceramic capacitor 2 according to the present embodiment is easily contained in the board 40 as shown in FIG. 4, and the package including the board 40 can be downsized.

In the multilayer ceramic capacitor 2 according to the present embodiment, the via-hole electrodes 52 are embedded into the via holes 50 formed on the element body 4 so that the predetermined clearance spaces 54 are formed in the via holes 50. Since the clearance spaces 54 are formed in the via holes 50, for example, a load from outside (e.g., pickup load) generates a deformation (metal deformation) of the electrodes 52 against the clearance spaces 54 and is less transmitted to the ceramic element body 4. Thus, the element body 4 is further strengthened even if it is thinned, and the element body 4 has fewer cracks and is less broken.

In the present embodiment, an area ratio of the clearance space 54 to the via-hole electrode 52 (clearance space ratio) is preferably 1 to 60% (more preferably 5 to 60%, still more preferably 5 to 30%) on a cross section of the element body 4 parallel to the internal electrode layers 12. In this range, the element body 4 is further strengthened even if it is thinned, and the element body 4 has fewer cracks and is improved in thermal shock characteristics.

In the present embodiment, the via-hole electrodes 52 are located on the inner side of the element body 4 (the center side in the Y-axis direction) in the via holes 50, and the clearance spaces 54 are located on the outer side of the element body 4 (on the other side of the center in the Y-axis direction) in the via holes 50. In this structure, a stress generated in a central part of the element body 4 by external force more easily escapes to the outside, and the multilayer ceramic capacitor 2 is thereby further strengthened.

In the present embodiment, no electrode layer is formed on the lower surface 4d, the first lateral surface 4a, the second lateral surface 4b, or the lateral surfaces 4e of the element body 4. In this structure, a stress generated in the element body 4 by external force more easily escapes to the outside, and the multilayer ceramic capacitor 2 is thereby further strengthened. Since no electrode layer is formed on the lower surface of the element body 4, the lower surface of the element body 4 is easily a flat surface and is, for example, easily embedded into the board 40 shown in FIG. 4. When the flat surface (the lower surface 4d of the element body 4) is installed on a mounting surface, the element body 4 is closely attached on the mounting surface, and the bending strength of the multilayer ceramic electronic capacitor is improved.

Second Embodiment

Figure 1B:
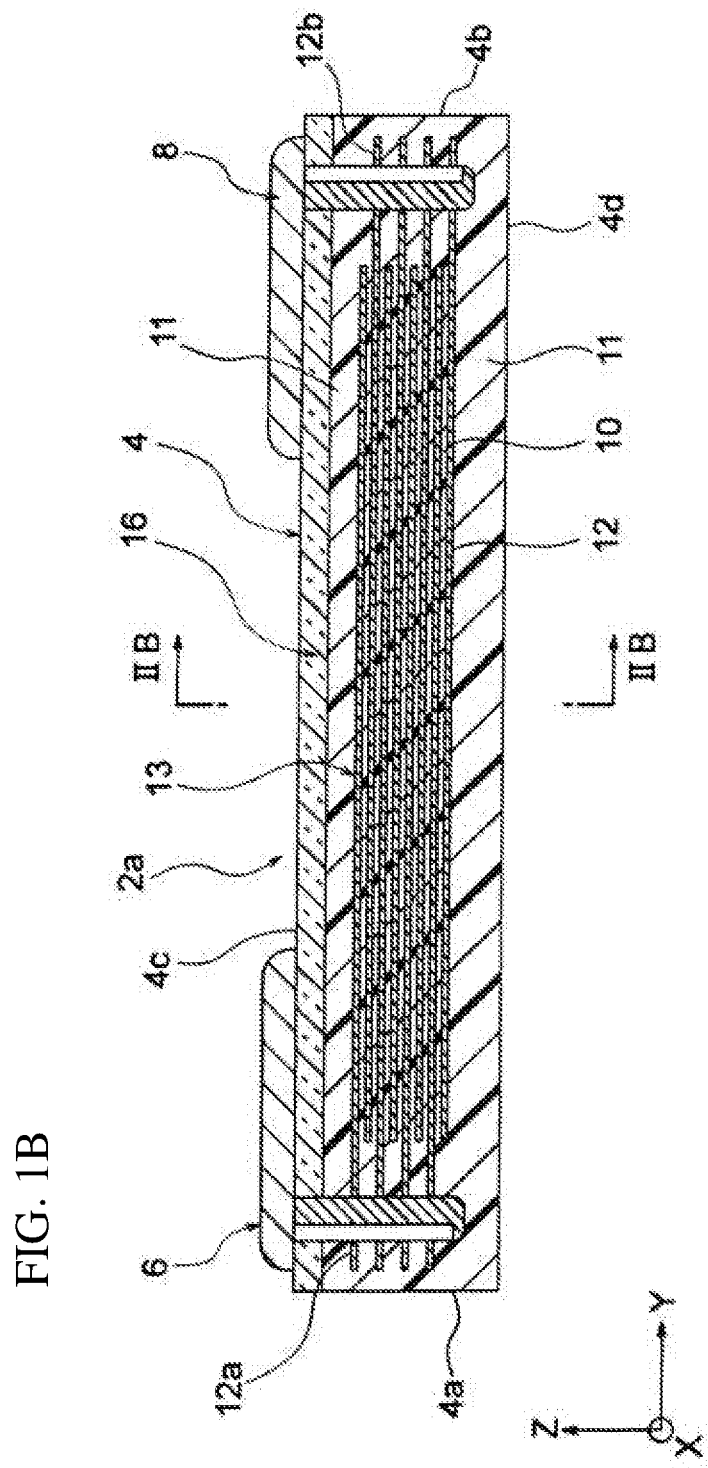
FIG. 1B is a longitudinal cross-sectional view of a multilayer ceramic capacitor according to another embodiment of the present invention.
Figure 2B:
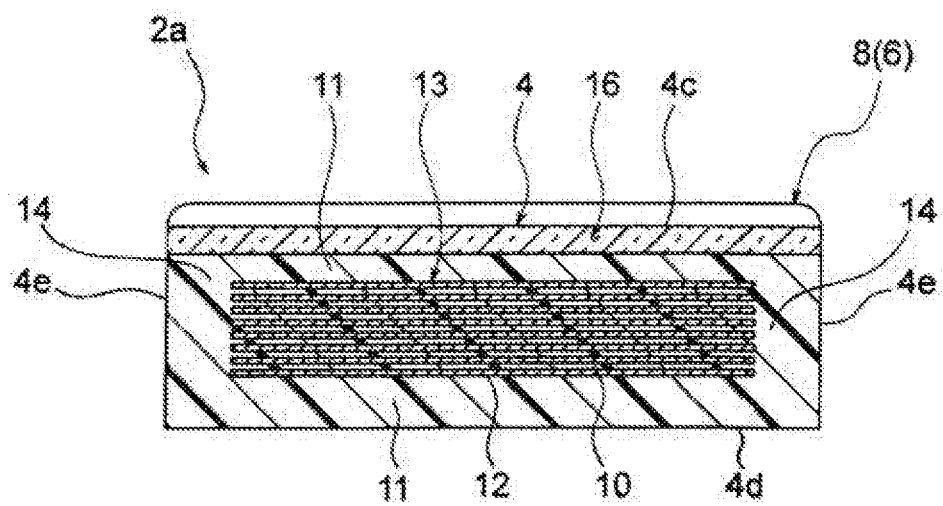
FIG. 2B is a transverse cross-sectional view of the multilayer ceramic capacitor along the IIB-IIB line shown in FIG. 1B.

Except for the following matters, as shown in FIG. 1B and FIG. 2B, a multilayer ceramic capacitor 2a according to the present embodiment is similar to the multilayer ceramic capacitor 2 according to First Embodiment. In the multilayer ceramic capacitor 2a, the upper surface 4c (or the lower surface 4d) of the element body 4 includes an upper-surface reinforcement layer 16 made of a material that is stronger than the inner dielectric layers 10, and the outer surface of the upper-surface reinforcement layer 16 defines the upper surface 4c (or the lower surface 4d) of the element body 4.

After the element body 4 is formed similarly to First Embodiment, the upper-surface reinforcement layer 16 is formed on the upper surface 4c (or the lower surface 4d) of the element body 4 before the first and second terminal electrodes 6 and 8 are formed. The upper-surface reinforcement layer 16 is not limited and is glass, alumina based composite material, zirconia based composite material, polyimide resin, epoxy resin, aramid fiber, fiber reinforced plastic, or the like.

This structure further improves the strength of the multilayer ceramic capacitor 2a. In the multilayer ceramic capacitor 2a having an improved strength, even if the element body 4 is thinned, the element body 4 easily has a large length y0 in the longitudinal direction (see FIG. 1A) and a large width x0 (see FIG. 2A), a facing area between the internal electrode layers 12 in the element body 4 is large, and characteristics (e.g., capacitance) of the capacitor 2b are further improved.

Incidentally, the upper-surface reinforcement layer 16 may contain any glass components, but preferably contains $SiO_2$, BaO, $Al_2O_3$, alkali metal, CaO, SrO, and $B_2O_3$. Preferably, 30 to 70 mass % of $SiO_2$, which is contained as a glass component of the upper-surface reinforcement layer 16, are contained in the glass components of the upper-surface reinforcement layer 16. When the above-mentioned amount of $SiO_2$ is contained, an adequate amount of a network-former oxide is obtained, and plating resistance is favorable, compared to when less amount of $SiO_2$ is contained. When the above-mentioned amount of $SiO_2$ is contained, a softening point is prevented from being too high, and an operation temperature is prevented from being too high, compared to when more amount of $SiO_2$ is contained.

Preferably, 20 to 60 mass % of BaO, which is contained as a glass component of the upper-surface reinforcement layer 16 of the present embodiment, are contained in the glass components of the upper-surface reinforcement layer 16. When the above-mentioned amount of BaO is contained, compared to when less amount of BaO is contained, delamination is less likely to occur due to favorable adhesion with the dielectric, crack is less likely to occur due to prevention of thermal expansion coefficient from being too small, and in a case where the dielectric layers are $BaTiO_3$, HALT reliability is prevented from being worse due to prevention of Ba from being eluted into the glass components. When the above-mentioned amount of BaO is contained, vitrification and plating resistance are favorable, compared to when more amount of BaO is contained.

Preferably, 1 to 15 mass % of $Al_2O_3$, which is contained as a glass component of the upper-surface reinforcement layer 16 of the present embodiment, are contained in the glass components of the upper-surface reinforcement layer 16. When the above-mentioned amount of $Al_2O_3$ is contained, plating resistance is favorable, compared to when less amount of $Al_2O_3$ is contained. When the above-mentioned amount of $Al_2O_3$ is contained, a softening point is prevented from being too high, compared to when more amount of $Al_2O_3$ is contained.

Preferably, 70 to 100 mass % of $SiO_2$, BaO, and $Al_2O_3$ are contained in total in the glass components constituting the upper-surface reinforcement layer 16 of the present embodiment. This makes it easier to form a Ba—Ti—Si—O phase in a boundary between the dielectric and the upper-surface reinforcement layer 16.

The alkali metal contained as a glass component constituting the upper-surface reinforcement layer 16 of the present embodiment is Li, Na, K, etc., but is preferably K or Na in view of thermal expansion coefficient. Preferably, 0.1 to 15 mass % of the alkali metal, which is contained as a glass component constituting the upper-surface reinforcement layer 16 of the present embodiment, are contained in the glass components of the upper-surface reinforcement layer 16. This can increase thermal expansion coefficient. When the above-mentioned amount of the alkali metal is contained, plating resistance can be favorable, compared to when more amount of the alkali metal is contained.

Preferably, 0 to 15 mass % of CaO, which is contained as a glass component constituting the upper-surface reinforcement layer 16 of the present embodiment, are contained in the glass components of the upper-surface reinforcement layer 16. This can increase thermal expansion coefficient and improve plating resistance.

Preferably, 0 to 20 mass % of SrO, which is contained as a glass component constituting the upper-surface reinforcement layer 16 of the present embodiment, are contained in the glass components of the upper-surface reinforcement layer 16. This can increase thermal expansion coefficient and improve plating resistance. When the above-mentioned amount of SrO is contained, insulation and reliability of the chip can be improved due to prevention of SrO from reacting with $BaTiO_3$, compared to when more amount of SrO is contained.

Preferably, 0 to 10 mass % of $B_2O_3$, which is contained as a glass component constituting the upper-surface reinforcement layer 16 of the present embodiment, are contained in the glass components of the upper-surface reinforcement layer 16. This can demonstrate the effect of the glass as a network-former oxide. When the above-mentioned amount of $B_2O_3$ is contained, plating resistance can be favorable compared to when more amount of $B_2O_3$ is contained.

In the present embodiment, the upper-surface reinforcement layer 16 constitutes only a part of the outer surface of the exterior region 11, but may constitute most or the whole of the exterior region 11. The upper-surface reinforcement layer 16 can be formed by applying a paste for the reinforcement layer on the upper surface 4c of the element body 4 and firing it.

The paste for the reinforcement layer is obtained by, for example, kneading the above-mentioned glass raw material, a binder whose main component is ethyl cellulose, and tarpineol and acetone (dispersion medium) using a mixer. The paste for the reinforcement layer is applied to the element body 4 by any method, such as dipping, printing, coating, vapor deposition, and spraying.

The element body 4 applied with the paste for the reinforcement layer is fired with any conditions and is, for example, fired by being held at 700° C. to 1300° C. for 0.1 to 3 hours in a humidified or dry $N_2$ atmosphere.

Third Embodiment

Figure 1C:
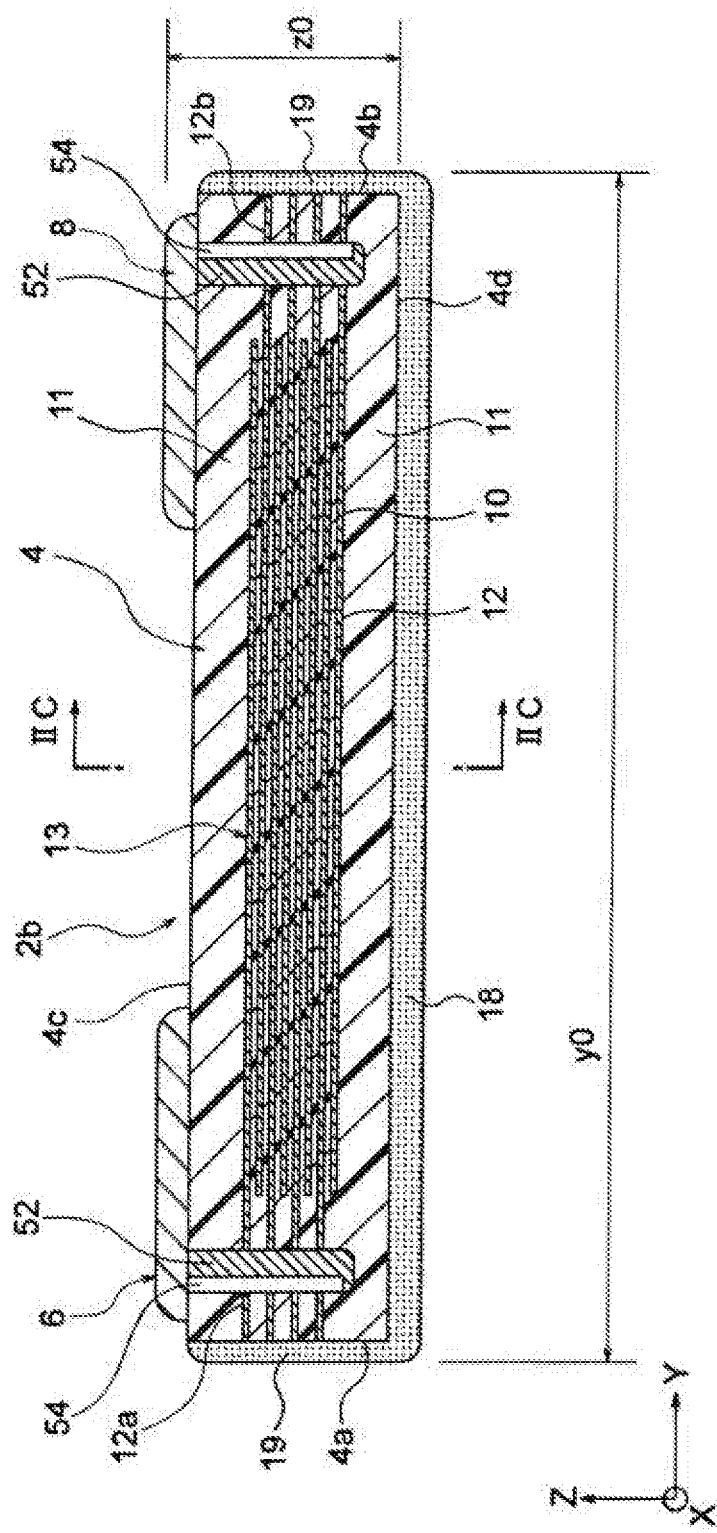
FIG. 1C is a longitudinal cross-sectional view of a multilayer ceramic capacitor according to further another embodiment of the present invention.
Figure 2C:
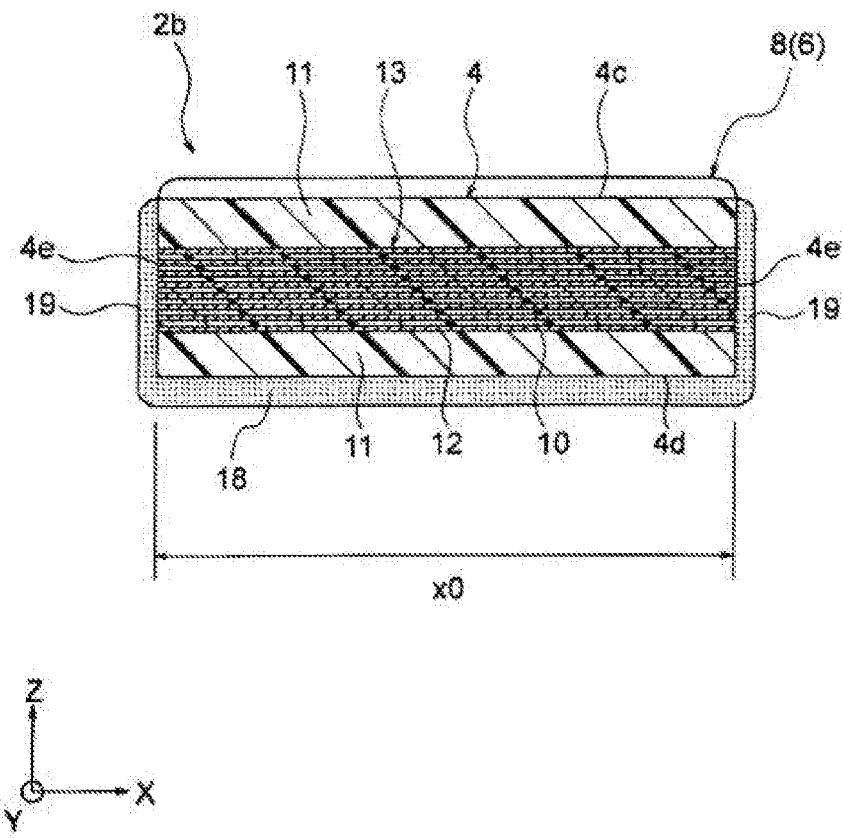
FIG. 2C is a transverse cross-sectional view of the multilayer ceramic capacitor along the IIC-IIC line shown in FIG. 1C.

Except for the following matters, as shown in FIG. 1C and FIG. 2C, a multilayer ceramic capacitor 2b according to the present embodiment is similar to the multilayer ceramic capacitors 2 and 2a according to First Embodiment and Second Embodiment. In the capacitor 2b, a bottom reinforcement layer 18 is formed to cover the lower surface 4d of the element body 4, and lateral reinforcement layers 19 are formed continuously to the bottom reinforcement layer 18 so as to cover the first lateral surface 4a, the second lateral surface 4b, and the lateral surfaces 4e of the element body 4.

In the present embodiment, as shown in FIG. 2C, both ends of the internal electrode layers 12 in the X-axis direction are exposed from the lateral surfaces of the element body 4 in the X-axis direction, and the lateral reinforcement layers 19 are formed on the first lateral surface 4a, the second lateral surface 4b, and the lateral surfaces 4e of the element body 4 so as to cover the exposed portion. In the present embodiment, compared to First Embodiment and Second Embodiment, when the element body 4 has the same length in the X-axis direction, it is possible to increase the width of the internal electrode layers 12 in the X-axis direction and capacitor capacity. In the present embodiment, the multilayer ceramic capacitor 2b has the bottom reinforcement layer 18 and/or the lateral reinforcement layers 19 and thereby has a further improved strength.

Incidentally, the bottom reinforcement layer 18 and/or the lateral reinforcement layers 19 are/is made of a material similar to that of the upper-surface reinforcement layer 16 of Second Embodiment and can be formed similarly to the upper-surface reinforcement layer 16 of Second Embodiment. However, the bottom reinforcement layer 18 and/or the lateral reinforcement layers 19 are/is not necessarily made of completely the same material as the upper-surface reinforcement layer 16 of Second Embodiment and are/is not necessarily formed by completely the same method as the upper-surface reinforcement layer 16 of Second Embodiment. Compared to the dielectric layers 10 or the exterior regions 11 forming the element body 4, the bottom reinforcement layer 18 and/or the lateral reinforcement layers 19 are/is preferably made of an insulation material having a low elasticity or a low linear thermal expansion coefficient.

Fourth Embodiment

Figure 3B:
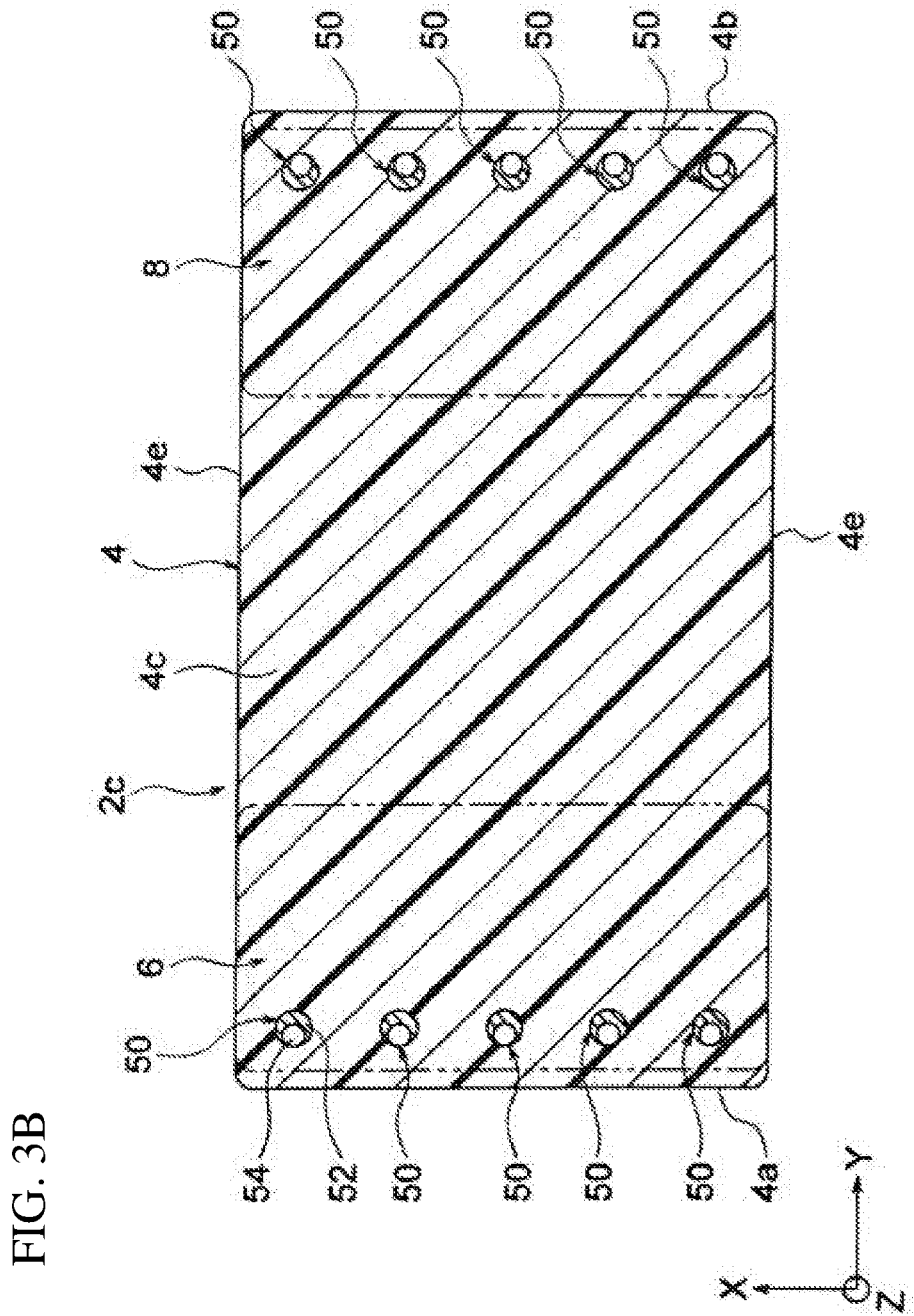
FIG. 3B is a top view of a variation of the multilayer ceramic capacitor shown in FIG. 3A.

Except for the following matters, as shown in FIG. 3B, a multilayer ceramic capacitor 2c according to the present embodiment is similar to the multilayer ceramic capacitors 2, 2a, and 2b according to First Embodiment to Third Embodiment. In the capacitor 2c, the clearance spaces 54 formed in the via holes 50 have a substantially circular cross-sectional shape, and the via-hole electrodes 52 have a crescent cross-sectional shape. The clearance spaces 54 are located on the outer side of the element body 4 in the Y-axis direction in the via holes 50. In the present embodiment, effects similar to those of the above-mentioned embodiments are also demonstrated.

Fifth Embodiment

Figure 3C:
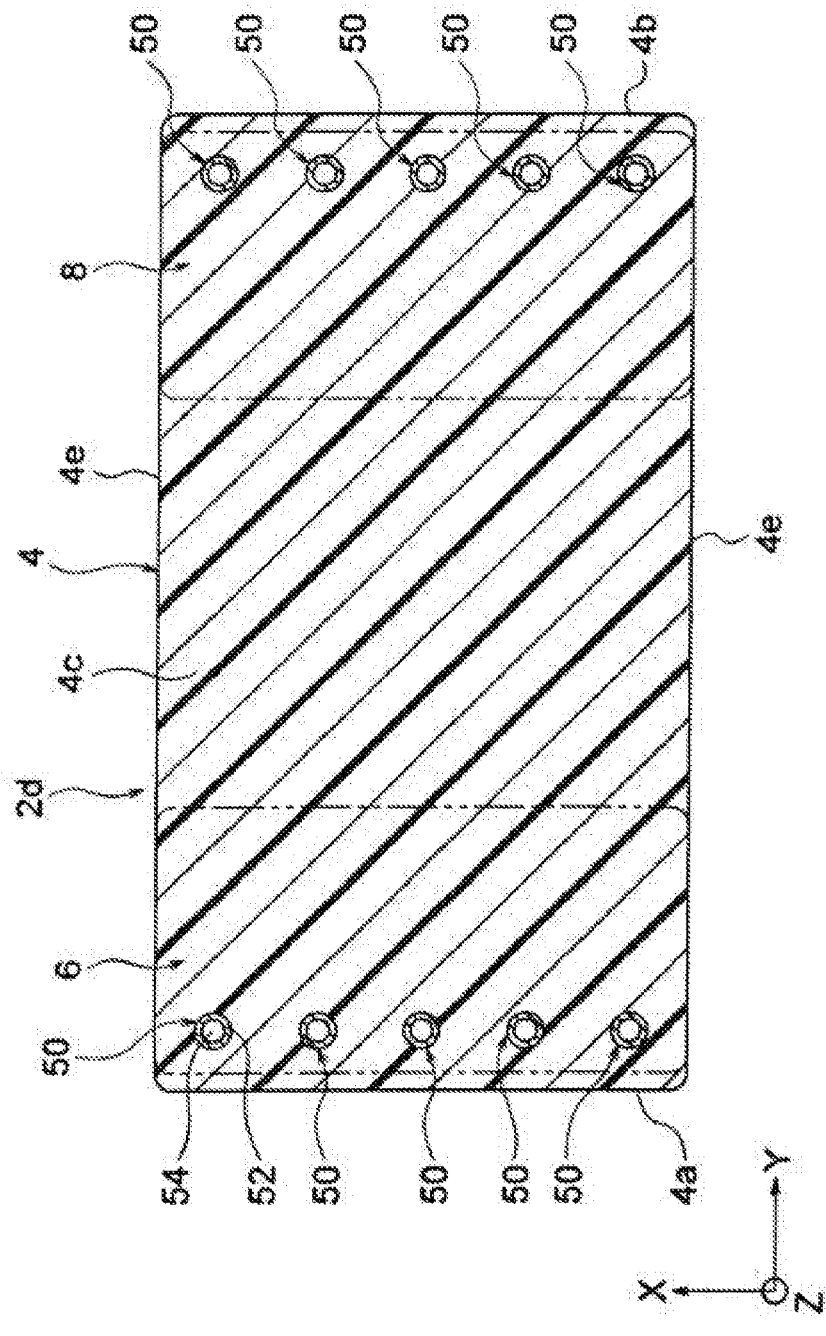
FIG. 3C is a top view of a variation of the multilayer ceramic capacitor shown in FIG. 3B.

Except for the following matters, as shown in FIG. 3C, a multilayer ceramic capacitor 2d according to the present embodiment is similar to the multilayer ceramic capacitors 2, 2a, 2b, and 2c according to First Embodiment to Fourth Embodiment. In the capacitor 2d, the clearance spaces 54 formed in the via holes 50 have a substantially circular cross-sectional shape, and the via-hole electrodes 52 have a ring cross-sectional shape. The clearance spaces 54 are located at the center of each of the via holes 50. In the present embodiment, effects similar to those of the above-mentioned embodiments are also demonstrated.

Sixth Embodiment

Figure 3D:
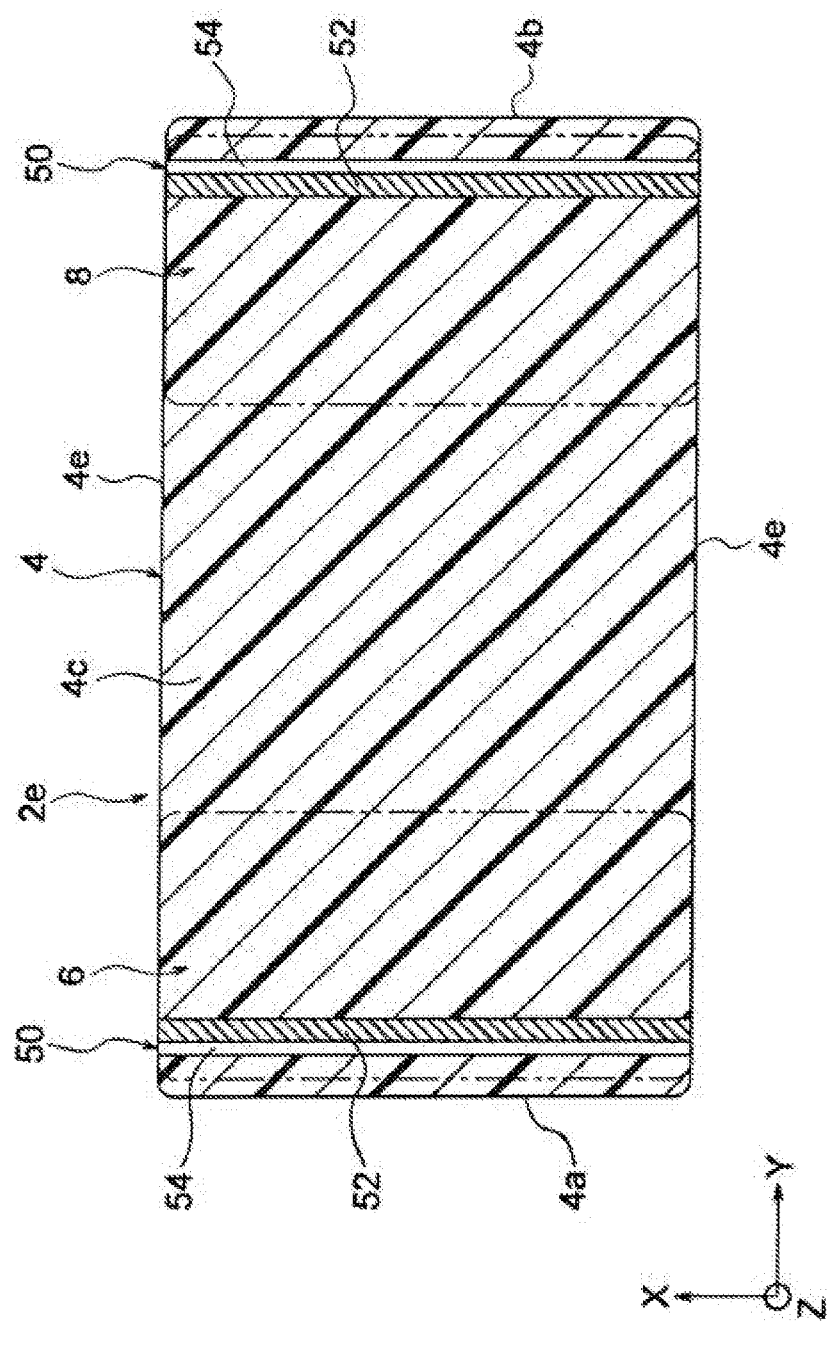
FIG. 3D is a top view of a variation of the multilayer ceramic capacitor shown in FIG. 3A.

Except for the following matters, as shown in FIG. 3D, a multilayer ceramic capacitor 2e according to the present embodiment is similar to the multilayer ceramic capacitors 2, 2a, 2b, 2c, and 2d according to First Embodiment to Fifth Embodiment. In the capacitor 2e, a pair of via holes 50 (a linear slit groove continuing in the X-axis direction) is formed near the first and second lateral surfaces 4a and 4b of the element body 4. In the slit-like via holes 50, the via-hole electrodes 52 are formed continuously (may be intermittently) along the extension direction of the via holes 50 and are located on the inner side of the element body 4 in the Y-axis direction. In the slit-like via holes 50, the clearance spaces 54 are formed continuously (may be intermittently) along the extension direction of the via holes 50 and are located on the outer side of the element body 4 in the Y-axis direction.

The Y-Z cross-sectional shapes of the via holes 50 and the via-hole electrodes 52 are similar to, for example, those of the embodiment shown in FIG. 1C and do not go through the element body 4. In the present embodiment shown in FIG. 3D, lateral reinforcement layers similar to the lateral reinforcement layers 19 shown in FIG. 1C preferably cover at least both ends of the via holes 50 in the X-axis direction (preferably, the entire lateral surfaces 4e) on the lateral surfaces 4e of the element body 4. This makes it possible to prevent water from entering the via holes 54 of the via holes 50.

In the present embodiment, the via holes 50 arranged on both sides of the element body 4 in the Y-axis direction have a slit groove shape continuing in the X-axis direction, and the clearance spaces 54 continuing in the X-axis direction are thereby easily formed on the outer side of the via holes 50 in the Y-axis direction. In the present embodiment, since the via holes 50 have a slit groove shape, a stress generated in a central part of the element body 4 by external force easily escapes to the outside, and the strength of the multilayer ceramic capacitor 2e thereby tends to further improve.

Figure 3E:
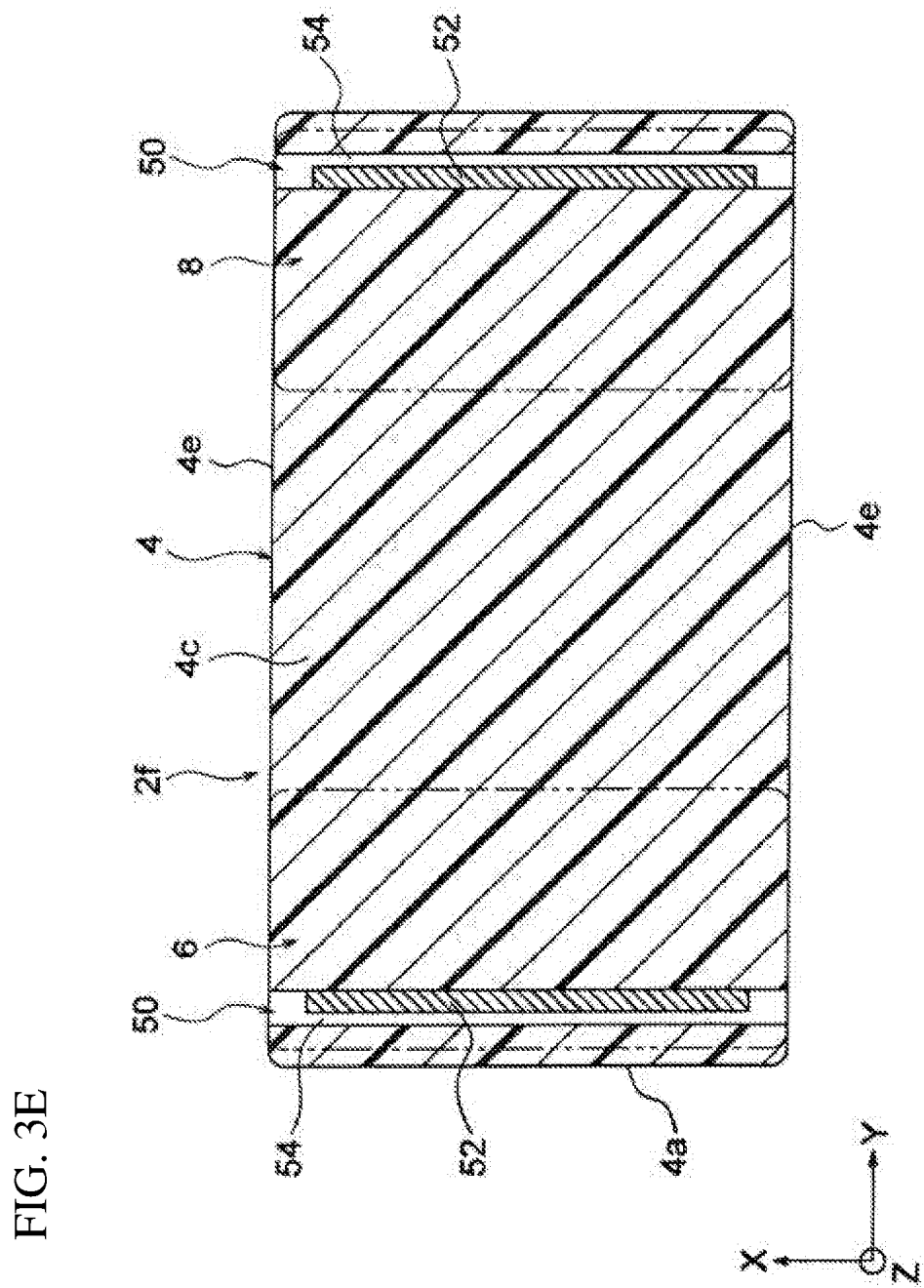
FIG. 3E is a top view of a variation of the multilayer ceramic capacitor shown in FIG. 3D.

Incidentally, the via holes 50 having a slit groove shape are illustrated to have a width that is substantially equal to the width of the element body 4 in the X-axis direction, but both ends of the via holes having a slit groove shape may not go through the element body 4 in the X-axis direction. In the multilayer ceramic capacitor 2f of the embodiment shown in FIG. 3E, the via-hole electrodes 52 do not need to be formed in the full length of the via holes 50 in the X-axis direction, and the clearance spaces 54 formed on both ends of the via-hole electrodes 52 in the X-axis direction are large. In these embodiments, effects similar to those of the above-mentioned embodiments are also demonstrated.

The present invention is not limited to the above-mentioned embodiments and can variously be changed within the scope of the present invention.

Figure 1D:
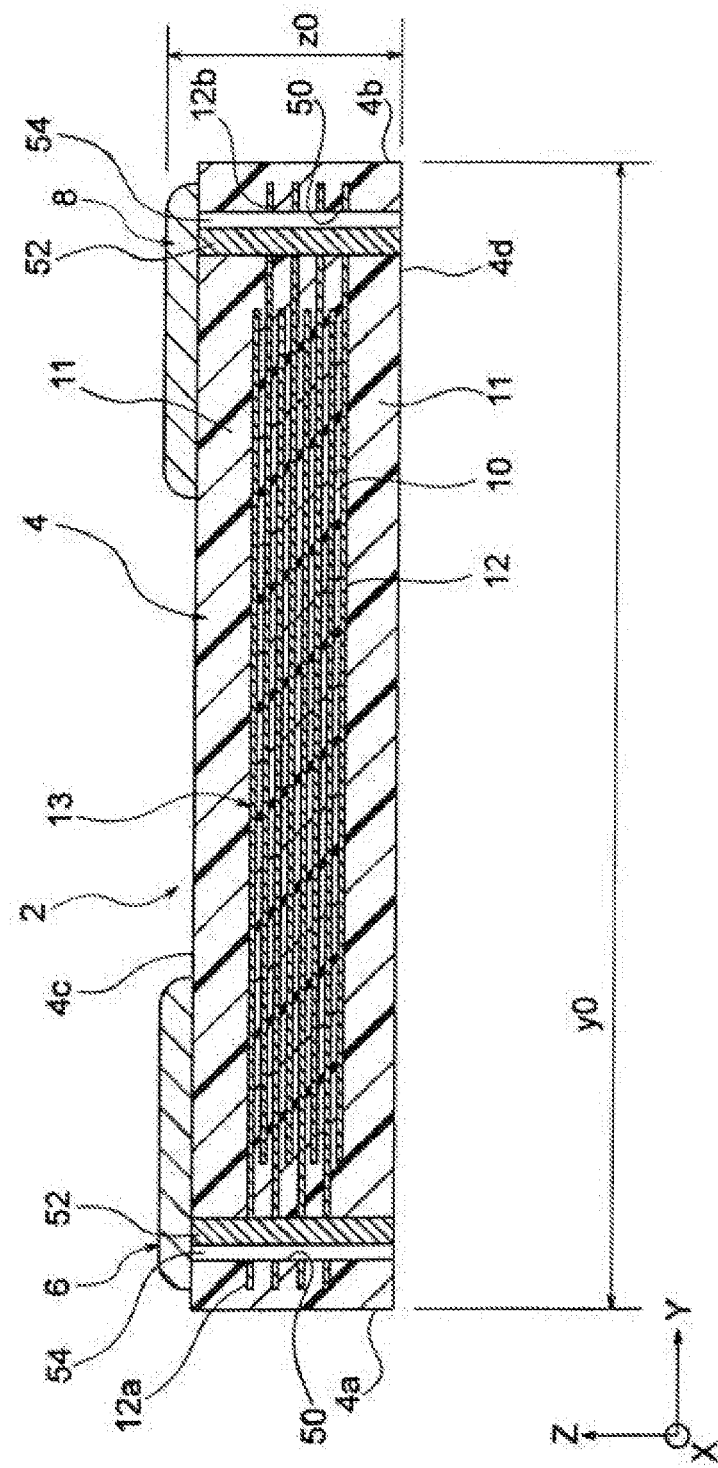
FIG. 1D is a longitudinal cross-sectional view of a multilayer ceramic capacitor according to further another embodiment of the present invention.

In the above-mentioned embodiments, for example, the via holes 50 are formed to reach the exterior region 11 near the lower surface 4d without going through from the upper surface 4c to the lower surface 4d of the element body 4, but the above-mentioned embodiments are not limited thereto. For example, as shown in FIG. 1D, the via holes 50 may be formed to go through from the upper surface 4c to the lower surface 4d of the element body 4. In this case, however, as shown in FIG. 1C, the bottom reinforcement layer 18 is preferably formed on the lower surface 4d of the element body 4. Instead, the bottom reinforcement layer 18 may not be formed, but the via holes 50 are preferably formed intermittently in the X-axis direction.

In the above-mentioned embodiments, the via holes 50 and the via-hole electrodes 52 are formed after being turned into pieces in each of the element bodies 4, and the first and second terminal electrodes 6 and 8 are also formed after being turned into pieces in each of the element bodies 4, but they may be formed beforehand. That is, the via holes 50 and the via-hole electrodes 52 are formed before being turned into pieces in each of the element bodies 4, and the first and second terminal electrodes 6 and 8 may also be formed before being turned into pieces in each of the element bodies 4.

The multilayer ceramic electronic component of the present invention is not limited to multilayer ceramic capacitors and may be applied to other multilayer electronic components. Other multilayer electronic components are all electronic components where dielectric layers (insulation layers) are laminated via internal electrodes and are, for example, bandpass filters, inductors, multilayer three-terminal filters, piezoelectric elements, PTC thermistors, NTC thermistors, and varistors.

EXAMPLES

Hereinafter, the present invention is explained based on more detailed examples, but the present invention is not limited to the examples.

Example 1

As described below, a multilayer ceramic capacitor 2 was manufactured.

100 parts by mass of $BaTiO_3$ based ceramic powder, 10 parts by mass of polyvinyl butyral resin, 5 parts by mass of dioctyl phthalate (DOP) as plasticizer, and 100 parts by mass of alcohol as solvent were initially mixed and turned into a paste in a ball mill to obtain a paste for inner green sheets.

Apart from the paste for inner green sheets, 44.6 parts by mass of Ni particles, 52 parts by mass of terpineol, 3 parts by mass of ethyl cellulose, and 0.4 parts by mass of benzotriazole were kneaded by a triple roll mill and turned into a slurry to obtain a paste for internal electrode layers.

Inner green sheets were formed on a PET film using the above-manufactured paste for inner green sheets. Next, internal electrode pattern layers were formed in a predetermined pattern using the paste for internal electrode layers, and the sheets were thereafter peeled from the PET film to obtain inner green sheets having the internal electrode pattern layers.

The inner green sheets having the internal electrode pattern layers obtained as described above were laminated alternately to manufacture an internal laminated body.

Next, an appropriate number of outer green sheets was formed on the top and bottom of the internal laminated body using a paste for outer green sheets and was pressed and adhered in the lamination direction to obtain a green laminated body. The paste for outer green sheets was obtained in a similar manner to the paste for inner green sheets.

Next, the green laminated body was cut to obtain green chips.

Next, the obtained green chips were debindered, fired, and annealed with the following conditions to obtain an element body 4.

In the debindering, the heating rate was 60° C./hour, the retention temperature was 260° C., the retention time was 8 hours, and the atmosphere was the air In the firing, the heating rate was 200° C./hour, the retention temperature was 1000° C. to 1200° C., and the temperature retention time was 2 hours. The cooling rate was 200° C./hour. Incidentally, the atmosphere gas was a humidified $N_2+H_2$ mixed gas.

In the annealing, the heating rate was 200° C./hour, the retention temperature was 500° C. to 1000° C., the temperature retention time was 2 hours, the cooling rate was 200° C./hour, and the atmosphere gas was a humidified $N_2$ gas.

Incidentally, a wetter was used for humidifying the atmosphere gas of the firing and the atmosphere gas of the annealing.

Next, as shown in FIG. 3A, a plurality of via holes 50 having a circular cross section was formed on the element body 4, and a first conductive paste was embedded into each of the via holes 50 in a predetermined pattern. After that, a second conductive paste was embedded into the remaining spaces of the via holes 50.

The first conductive paste was prepared by kneading 84 parts by mass of a mixture of spherical Cu particles (average particle size: 0.4 μm) and flaky Cu powder, 30 parts by mass of organic vehicle (5 parts by mass of ethyl cellulose resin were dissolved in 95 parts by mass of butyl carbitol), and 6 parts by mass of butyl carbitol. The mass ratio of metal component (conductive component) in the first conductive paste was 70 mass %.

The second conductive paste was prepared by kneading 84 parts by mass of a mixture of spherical Cu particles (average particle size: 0.4 μm) and flaky Cu powder, 280 parts by mass of spherical resin beads (average particle size: 5 μm), 30 parts by mass of organic vehicle (5 parts by mass of ethyl cellulose resin were dissolved in 95 parts by mass of butyl carbitol), and 6 parts by mass of butyl carbitol. The mass ratio of the resin beads in the second conductive paste was 70 mass %.

The element body 4 having the via holes 50 filled with the first and second conductive pastes was heated in $N_2$ atmosphere at 850° C. for 10 minutes. As shown in FIG. 3A, the via-hole electrodes 52 (the clearance spaces 54 were formed in the via holes 50) were thereby obtained.

Next, a paste for terminal electrodes was obtained by kneading 100 parts by mass of a mixture of spherical Cu particles (average particle size: 0.4 μm) and flaky Cu powder, 30 parts by mass of organic vehicle (5 parts by mass of ethyl cellulose resin were dissolved in 95 parts by mass of butyl carbitol), and 6 parts by mass of butyl carbitol.

The obtained paste for terminal electrodes was applied on the upper surface 4c of the element body 4 and was fired in $N_2$ atmosphere at 850° C. for 10 minutes to form the first and second terminal electrodes 6 and 8 only on the upper surface 4c. The thickness z0 of the obtained multilayer ceramic capacitor 2 in the Z-axis direction was 100 μm. Each thickness of the first and second terminal electrodes 6 and 8 was 15 μm. Each depth of the via holes 50 in the Z-axis direction was 80% of the thickness z0. The area ratio of the clearance space 54 to the via-hole electrode 52 (clearance space ratio) was 1%.

The clearance space ratio was measured as below. That is, in each of the via holes 50, three transverse cross sections (X-Y cross sections) were observed in the depth direction, and an average of the clearance space ratios was obtained.

Moreover, an average of the clearance space ratios in all of the via holes 50 of the element body 4 was calculated and considered to be a value of the clearance space ratio shown in Table 1.

Incidentally, one of the three transverse cross sections was a central part of each of the via holes 50 (see FIG. 1A) in the depth direction, and the other two transverse cross sections were boundary parts between the interior region 13 and the two exterior regions 11.

100 samples were similarly manufactured and subjected to a loading test. In the loading test, both ends of the lower surface 4d of the element body 4 in the Y-axis direction were held, and a load of 1.0N, which was larger than a normal pickup load, was applied to a central part of the upper surface 4c of the element body 4. Then, the number of cracks observed in the exterior of the element body 4 was evaluated. The results are shown in Table 1.

In addition, 1000 samples were similarly manufactured and subjected to a thermal shock test. The thermal shock test was carried out as below.

First, a cream solder was applied on a test substrate, and a plurality of test sample capacitors 2 was mounted on the cream solder. The capacitors were soldered by heating using a belt-furnace-type reflow furnace. The heating was carried out at the maximum temperature (250° C.) for 10 seconds. The insulation resistance of the substrate (the capacitor 2 was mounted) was measured by a commercially available IR meter. The IR value after 30 seconds of voltage application (measurement voltage: 6.3V) was measured. In all of the samples, the insulation resistance before the thermal shock test was $10^9$(1.0E+09) $\Omega$ or more.

Next, the test substrate was put into a thermal shock test equipment (NT3701W made by WINTECH). In the test, the minimum temperature was −55° C., and the maximum temperature was 125° C. Each of the temperature transition time during temperature rising from −55° C. to 125° C. and the temperature transition time during temperature falling from 125° C. to −55° C. was five minutes ($\Delta$36° C./min). Each of the temperature retention time at −55° C. and the temperature retention time at 125° C. was 10 minutes.

The definition of one cycle of the thermal shock was as follows. That is, the temperature was retained at −55° C. for 10 minutes, increased to 125° C. for 5 minutes, retained at 125° C. for 10 minutes, and decreased to −55° C. for 5 minutes. After the cycle test reached 2000 cycles, the test substrate was removed, and the insulation resistance of the substrate (the capacitor 2 was mounted) was measured similarly to before the test by a commercially available IR meter.

"Evaluation A" was given when the insulation resistance did not change by $10^9$(1.0E+09) $\Omega$ or more in all of the samples both before the test and after the test. "Evaluation B" was given when there was a sample where the insulation resistance changed from $10^9$(1.0E+09) $\Omega$ or more to $10^8$(1.0E+08) $\Omega$ or more.

"Evaluation C" was given when there was a sample where the insulation resistance changed from $10^9$(1.0E+09) $\Omega$ or more to $10^4$(1.0E+04) $\Omega$ or more. "Evaluation D" was given when there was a sample where the insulation resistance changed from $10^9$(1.0E+09) $\Omega$ or more to $10^4$(1.0E+04) $\Omega$ or more. "Evaluation E" was given when there was a sample where the insulation resistance changed from $10^9$(1.0E+09) $\Omega$ or more to $10^3$(1.0E+03) $\Omega$ or more. "Evaluation F" was given when the conduction was open, and the insulation resistance before the thermal shock test could not be measured. The results are shown in Table 1.

Example 2

Except for the following matters, samples of a multilayer ceramic capacitor 2e shown in FIG. 3D were manufactured similarly to Example 1. In Example 2, as shown in FIG. 3D, a pair of via holes 50 (linear slit grooves continuing in the X-axis direction) was formed near the first and second lateral surfaces 4a and 4b of the element body 4, and the via-hole electrodes 52 were linearly formed so that the clearance spaces 54 were located on the outer side in the via holes 50. The samples were measured in terms of clearance space ratio similarly to Example 1. The results of the loading test and the thermal shock test are shown in Table 1.

Example 3

Except for the following matters, samples of a multilayer ceramic capacitor 2 shown in FIG. 1A and FIG. 3A were manufactured similarly to Example 1. In Example 3, the mass ratio of metal component (conductive component) in the first conductive paste was 72 mass %, the mass ratio of resin beads in the second conductive paste was 72 mass %. The application area ratio of the second conductive paste in the via hole 50 was larger than that of Example 1. The samples were measured in terms of clearance space ratio similarly to Example 1. The results of the loading test and the thermal shock test are shown in Table 1.

Example 4

Except for the following matters, samples of a multilayer ceramic capacitor 2e shown in FIG. 3D were manufactured similarly to Example 3. In Example 4, as shown in FIG. 3D, a pair of via holes 50 (linear slit grooves continuing in the X-axis direction) was formed near the first and second lateral surfaces 4a and 4b of the element body 4, and the via-hole electrodes 52 were linearly formed so that the clearance spaces 54 were located on the outer side in the via holes 50. The samples were measured in terms of clearance space ratio similarly to Example 3. The results of the loading test and the thermal shock test are shown in Table 1.

Example 5

Except for the following matters, samples of a multilayer ceramic capacitor 2 shown in FIG. 1A and FIG. 3A were manufactured similarly to Example 3. In Example 5, the mass ratio of metal component (conductive component) in the first conductive paste was 73 mass %, the mass ratio of resin beads in the second conductive paste was 73 mass %. The application area ratio of the second conductive paste in the via hole 50 was larger than that of Example 3. The samples were measured in terms of clearance space ratio similarly to Example 1. The results of the loading test and the thermal shock test are shown in Table 1.

Example 6

Except for the following matters, samples of a multilayer ceramic capacitor 2e shown in FIG. 3D were manufactured similarly to Example 5. In Example 6, as shown in FIG. 3D, a pair of via holes 50 (linear slit grooves continuing in the X-axis direction) was formed near the first and second lateral surfaces 4a and 4b of the element body 4, and the via-hole electrodes 52 were linearly formed so that the clearance spaces 54 were located on the outer side in the via holes 50. The samples were measured in terms of clearance space ratio similarly to Example 5. The results of the loading test and the thermal shock test are shown in Table 1.

Example 7

Except for the following matters, samples of a multilayer ceramic capacitor 2 shown in FIG. 1A and FIG. 3A were manufactured similarly to Example 5. In Example 7, the mass ratio of metal component (conductive component) in the first conductive paste was 75 mass %, the mass ratio of resin beads in the second conductive paste was 75 mass %. The application area ratio of the second conductive paste in the via hole 50 was larger than that of Example 5. The samples were measured in terms of clearance space ratio similarly to Example 5. The results of the loading test and the thermal shock test are shown in Table 1.

Example 8

Except for the following matters, samples of a multilayer ceramic capacitor 2e shown in FIG. 3D were manufactured similarly to Example 7. In Example 8, as shown in FIG. 3D, a pair of via holes 50 (linear slit grooves continuing in the X-axis direction) was formed near the first and second lateral surfaces 4a and 4b of the element body 4, and the via-hole electrodes 52 were linearly formed so that the clearance spaces 54 were located on the outer side in the via holes 50. The samples were measured in terms of clearance space ratio similarly to Example 7. The results of the loading test and the thermal shock test are shown in Table 1.

Example 9

Except for the following matters, samples of a multilayer ceramic capacitor 2 shown in FIG. 1A and FIG. 3A were manufactured similarly to Example 7. In Example 9, the mass ratio of metal component (conductive component) in the first conductive paste was 77 mass %, the mass ratio of resin beads in the second conductive paste was 77 mass %. The application area ratio of the second conductive paste in the via hole 50 was larger than that of Example 7. The samples were measured in terms of clearance space ratio similarly to Example 7. The results of the loading test and the thermal shock test are shown in Table 1.

Example 10

Except for the following matters, samples of a multilayer ceramic capacitor 2e shown in FIG. 3D were manufactured similarly to Example 9. In Example 10, as shown in FIG. 3D, a pair of via holes 50 (linear slit grooves continuing in the X-axis direction) was formed near the first and second lateral surfaces 4a and 4b of the element body 4, and the via-hole electrodes 52 were linearly formed so that the clearance spaces 54 were located on the outer side in the via holes 50. The samples were measured in terms of clearance space ratio similarly to Example 7. The results of the loading test and the thermal shock test are shown in Table 1.

Example 11

Except for the following matters, samples of a multilayer ceramic capacitor 2 shown in FIG. 1A and FIG. 3A were manufactured similarly to Example 9. In Example 11, the mass ratio of metal component (conductive component) in the first conductive paste was 80 mass %, the mass ratio of resin beads in the second conductive paste was 80 mass %. The application area ratio of the second conductive paste in the via hole 50 was larger than that of Example 9. The samples were measured in terms of clearance space ratio similarly to Example 9. The results of the loading test and the thermal shock test are shown in Table 1.

Example 12

Except for the following matters, samples of a multilayer ceramic capacitor 2e shown in FIG. 3D were manufactured similarly to Example 11. In Example 12, as shown in FIG. 3D, a pair of via holes 50 (linear slit grooves continuing in the X-axis direction) was formed near the first and second lateral surfaces 4a and 4b of the element body 4, and the via-hole electrodes 52 were linearly formed so that the clearance spaces 54 were located on the outer side in the via holes 50. The samples were measured in terms of clearance space ratio similarly to Example 11. The results of the loading test and the thermal shock test are shown in Table 1.

Example 13

Except for the following matters, samples of a multilayer ceramic capacitor 2 shown in FIG. 1A and FIG. 3A were manufactured similarly to Example 11. In Example 13, the mass ratio of metal component (conductive component) in the first conductive paste was 90 mass %, the mass ratio of resin beads in the second conductive paste was 90 mass %. The application area ratio of the second conductive paste in the via hole 50 was larger than that of Example 11. The samples were measured in terms of clearance space ratio similarly to Example 11. The results of the loading test and the thermal shock test are shown in Table 1.

Example 14

Except for the following matters, samples of a multilayer ceramic capacitor 2e shown in FIG. 3D were manufactured similarly to Example 13. In Example 14, as shown in FIG. 3D, a pair of via holes 50 (linear slit grooves continuing in the X-axis direction) was formed near the first and second lateral surfaces 4a and 4b of the element body 4, and the via-hole electrodes 52 were linearly formed so that the clearance spaces 54 were located on the outer side in the via holes 50. The samples were measured in terms of clearance space ratio similarly to Example 13. The results of the loading test and the thermal shock test are shown in Table 1.

Example 15

Except for the following matters, samples of a multilayer ceramic capacitor were manufactured similarly to Example 1. In Example 15, the first terminal electrode 6 shown in FIG. 1A was extended to cover the entire first lateral surface 4a from the upper surface 4c of the element body, and the second terminal electrode 8 shown in FIG. 1A was extended to cover the entire second lateral surface 4b from the upper surface 4c of the element body. That is, the first and second terminal electrodes 6 and 8 had an L cross-sectional shape. The samples were measured in terms of clearance space ratio similarly to Example 1. The results of the loading test and the thermal shock test are shown in Table 1.

Example 16

Except for the following matters, samples of a multilayer ceramic capacitor 2e shown in FIG. 3D were manufactured similarly to Example 15. In Example 16, as shown in FIG. 3D, a pair of via holes 50 (linear slit grooves continuing in the X-axis direction) was formed near the first and second lateral surfaces 4a and 4b of the element body 4, and the via-hole electrodes 52 were linearly formed so that the clearance spaces 54 were located on the outer side in the via holes 50. The samples were measured in terms of clearance space ratio similarly to Example 15. The results of the loading test and the thermal shock test are shown in Table 1.

Example 17

Except for the following matters, samples of a multilayer ceramic capacitor 2 shown in FIG. 1A and FIG. 3A were manufactured similarly to Example 13. In Example 17, the mass ratio of metal component (conductive component) in the first conductive paste was 60 mass %, the mass ratio of resin beads in the second conductive paste was 95 mass %. The application area ratio of the second conductive paste in the via hole 50 was larger than that of Example 13. The samples were measured in terms of clearance space ratio similarly to Example 11. The results of the loading test and the thermal shock test are shown in Table 1.

Comparative Example 1

Except for the following matters, samples of a multilayer ceramic capacitor were manufactured similarly to Example 1. In Comparative Example 1, the mass ratio of metal component (conductive component) in the first conductive paste was 95 mass %, and only the first conductive paste was filled into the via holes. The second conductive paste was not applied. The samples were measured in terms of clearance space ratio similarly to Example 1. The results of the loading test and the thermal shock test are shown in Table 1.

Evaluation

As shown in Table 1, the results of the loading test were favorable in all of Examples compared to Comparative Example 1. It was confirmed that both the results of the loading test and the results of the thermal shock test were favorable by adjusting the clearance space ratio of the via holes. It was also confirmed that if there was the same clearance space ratio, the results of the loading test were improved when the terminal electrode was formed only on the upper surface of the element body, compared to when the terminal electrode had an L cross-sectional shape.

TABLE 1

| | Terminal Structure | Shape of Via Holes | Position of Via Holes | Presence of Clearance Space in Via Holes | Clearance Space Ratio (%) | Mass Ratio of Metal Component in First Conductive Paste (%) | Mass Ratio of Resin Beads in Second Conductive Paste (%) | Loading Test Presence of cracks | Thermal Shock Test (Cycle Test) |
|---|---|---|---|---|---|---|---|---|---|
| Ex. 1 | only upper surface | circular | lateral surface | yes | 1 | 70 | 70 | 4 | A |
| Ex. 2 | only upper surface | linear | lateral surface (and outer side) | yes | 1 | 70 | 70 | 2 | A |
| Ex. 3 | only upper surface | circular | lateral surface | yes | 5 | 72 | 72 | 0 | A |
| Ex. 4 | only upper surface | linear | lateral surface (and outer side) | yes | 5 | 72 | 72 | 0 | A |
| Ex. 5 | only upper surface | circular | lateral surface | yes | 10 | 73 | 73 | 0 | A |
| Ex. 6 | only upper surface | linear | lateral surface (and outer side) | yes | 10 | 73 | 73 | 0 | A |
| Ex. 7 | only upper surface | circular | lateral surface | yes | 20 | 75 | 75 | 0 | A |
| Ex. 8 | only upper surface | linear | lateral surface (and outer side) | yes | 20 | 75 | 75 | 0 | A |
| Ex. 9 | only upper surface | circular | lateral surface | yes | 30 | 77 | 77 | 0 | A |
| Ex. 10 | only upper surface | linear | lateral surface (and outer side) | yes | 30 | 77 | 77 | 0 | A |
| Ex. 11 | only upper surface | circular | lateral surface | yes | 40 | 80 | 80 | 0 | B |
| Ex. 12 | only upper surface | linear | lateral surface (and outer side) | yes | 40 | 80 | 80 | 0 | B |
| Ex. 13 | only upper surface | circular | lateral surface | yes | 60 | 90 | 90 | 0 | C |
| Ex. 14 | only upper surface | linear | lateral surface (and outer side) | yes | 60 | 90 | 90 | 0 | C |
| Ex. 15 | L shape | circular | lateral surface | yes | 1 | 70 | 70 | 8 | D |
| Ex. 16 | L shape | linear | lateral surface | yes | 1 | 70 | 70 | 6 | D |
| Ex. 17 | only upper surface | circular | lateral surface | yes | 80 | 60 | 95 | 0 | F |
| Comp. Ex. 1 | only upper surface | circular | lateral surface | no | 0 | 95 | — | 10 | E |

DESCRIPTION OF THE REFERENCE NUMERICAL

2, 2a-2f . . . multilayer ceramic capacitor
4 . . . element body
4a . . . first lateral surface
4b . . . second lateral surface
4c . . . upper surface
4d . . . lower surface
4e . . . lateral surface
6 . . . first terminal electrode
8 . . . second terminal electrode
10 . . . inner dielectric layer
11 . . . exterior region
12 . . . internal electrode layer
12a . . . leading part (first leading part)
12b . . . leading part (second leading part)
13 . . . interior region
14 . . . side-gap region 16 . . . upper-surface reinforcement layer
18 . . . bottom reinforcement layer
19 . . . lateral reinforcement layer
40 . . . multilayer substrate
40a . . . circuit board
42, 42a . . . wiring pattern
50 . . . via hole
52 . . . via-hole electrode
54 . . . clearance space
60 . . . solder

What is claimed is:

1. A multilayer ceramic electronic component comprising:
an element body including internal electrode layers and insulation layers alternately laminated in a lamination direction and having an element body center axis in the lamination direction;
  a first via hole in the element body and having a first via hole longitudinal axis in the lamination direction;
  a first via-hole electrode (1) in the first via hole, (2) extending from an upper surface of the element body into the first via hole, (3) directly connected with at least one of the internal electrode layers, and (4) having a first via-hole electrode cross sectional area in a plane perpendicular to the lamination direction that is smaller than a first via hole cross sectional area of the first via hole in the plane perpendicular to the lamination direction such that a predetermined vacant clearance space is in the first via hole between the first via-hole electrode and a wall forming the first via hole that extends in the lamination direction;
  and a terminal electrode that covers an opening of the vacant clearance space, connects with the first via-hole electrode and is on the upper surface of the element body, the terminal electrode entering the vacant clearance space of the via hole without reaching the internal electrode layers,
  wherein the first via-hole electrode is positioned in the first via hole such that the vacant clearance space has a clearance space longitudinal axis that is offset from the first via hole longitudinal axis, in the plane perpendicular to the lamination direction, on the opposite side of the first via hole longitudinal axis from the element body center axis.

2. The multilayer ceramic electronic component according to claim 1, wherein a ratio of a cross sectional area of the clearance space in the plane perpendicular to the lamination direction to the via-hole electrode cross sectional area is 1 to 60%.

3. The multilayer ceramic electronic component according to claim 1, wherein the via hole has a circular or slit shape when viewed from the upper surface of the element body.

4. The multilayer ceramic electronic component according to claim 1, further comprising:
  a second via hole in the element body; and
  a second via-hole electrode in the second via hole, wherein
  one end of one layer of the internal electrode layers includes a first leading part close to a first exterior surface of the element body,
  a second end of a second layer of the internal electrode layers includes a second leading part close to a second exterior surface of the element body,
  the first via-hole electrode is connected with the first leading part, and
  the second via-hole electrode is connected with the second leading part.

5. The multilayer ceramic electronic component according to claim 1, wherein the terminal electrode is not on a lower surface or lateral surfaces of the element body.

6. The multilayer ceramic electronic component according to claim 1, wherein a reinforcement layer covers a lower surface and/or lateral surfaces of the element body.

7. A method of producing the multilayer ceramic electronic component according to claim 1, the method comprising:
  preparing the element body including the internal electrode layers and the insulation layers alternately laminated in the lamination direction;
  forming the first via hole in the element body;
  embedding a first conductive paste containing 70 mass % or more of conductive component into the first via hole so that the predetermined vacant clearance space is formed in the first via hole;
  embedding a second conductive paste containing 70 mass % or more of resin beads into the predetermined vacant clearance space in the first via hole; and
  forming the first via-hole electrode by heating the first conductive paste and the second conductive paste.

8. A multilayer ceramic electronic component comprising:
an element body including internal electrode layers and insulation layers alternately laminated in a lamination direction and having an element body center axis in the lamination direction;
  a first via hole in the element body and having a first via hole longitudinal axis in the lamination direction;
  a second via hole in the element body and having a second via hole longitudinal axis in the lamination direction, the second via hole being spaced from the first via hole in a direction perpendicular to the lamination direction;
  a first via-hole electrode (1) in the first via hole, (2) extending from an upper surface of the element body into the first via hole, (3) directly connected with at least one of the internal electrode layers, and (4) having a first via-hole electrode cross sectional area in a plane perpendicular to the lamination direction that is smaller than a first via hole cross sectional area of the first via hole in the plane perpendicular to the lamination direction such that a first predetermined vacant clearance space is in the first via hole between the first via-hole electrode and a wall forming the first via hole that extends in the lamination direction;
  a second via-hole electrode (1) in the second via hole, (2) extending from the upper surface of the element body into the second via hole, (3) directly connected with the at least one of the internal electrode layers, and (4) having a second via-hole electrode cross sectional area in the plane perpendicular to the lamination direction that is smaller than a second via hole cross sectional area of the second via hole in the plane perpendicular to the lamination direction such that a second predetermined vacant clearance space is in the second via hole between the second via-hole electrode and a wall forming the second via hole that extends in the lamination direction;
  a first terminal electrode formed on the upper surface of the element body and connected with the first via-hole electrode, electrode;
  and a second terminal electrode on the upper surface of the element body and connected with the second via hole electrode;
  wherein: one end of one layer of the internal electrode layers includes a first leading part close to a first exterior surface of the element body, a second end of a second layer of the internal electrode layers includes a second leading part close to a second exterior surface of the element body, the first via-hole electrode is connected with the first leading part; the second via-hole electrode is connected with the second leading part;

the first via-hole electrode is positioned in the first via hole such that the first vacant clearance space has a first clearance space longitudinal axis that is offset from the first via hole longitudinal axis, in the plane perpendicular to the lamination direction, on the opposite side of the first via hole longitudinal axis from the element body center axis; the second via-hole electrode is positioned in the second via hole such that the second vacant clearance space has a second clearance space longitudinal axis that is offset from the second via hole longitudinal axis, in the plane perpendicular to the lamination direction, on the opposite side of the second via hole longitudinal axis from the element body center axis;

the first terminal electrode covers an opening of the first vacant clearance space to connect with the first via-hole electrode and may enter the first vacant space of the first via hole without reaching the first leading part, and the second terminal electrode covers an opening of the second vacant clearance space to connect with the second via-hole electrode and may slightly enter the vacant clearance space of the via hole without reaching the second leading part.

9. The multilayer ceramic electronic component according to claim 1, wherein the first via hole has an inner diameter of 50 to 150 μm.

10. The multilayer ceramic electronic component according to claim 8, wherein the first and second via holes have an inner diameter of 50 to 150 μm.

* * * * *